United States Patent [19]

Katsuda et al.

[11] Patent Number: 6,001,760
[45] Date of Patent: Dec. 14, 1999

[54] ALUMINUM NITRIDE SINTERED BODY, METAL EMBEDDED ARTICLE, ELECTRONIC FUNCTIONAL MATERIAL AND ELECTROSTATIC CHUCK

[75] Inventors: Yuji Katsuda; Yukimasa Mori; Michio Takahashi, all of Nagoya, Japan; Yuki Bessho, San Jose, Calif.

[73] Assignee: NGK Insulators, Ltd., Japan

[21] Appl. No.: 08/824,560

[22] Filed: Mar. 25, 1997

[30] Foreign Application Priority Data

Mar. 29, 1996 [JP] Japan .................................. 8-099557
Mar. 11, 1997 [JP] Japan .................................. 9-072799

[51] Int. Cl.[6] .................................................. C04B 35/581
[52] U.S. Cl. .................... 501/98.4; 501/152; 279/128; 361/234; 428/689; 428/698
[58] Field of Search ................... 501/152, 98.4, 501/98.6, 98.5; 361/234; 279/128; 269/8; 428/689, 698

[56] References Cited

U.S. PATENT DOCUMENTS

| | | | |
|---|---|---|---|
| 4,618,592 | 10/1986 | Kuramoto et al. | 501/98.4 |
| 4,711,861 | 12/1987 | Sawamura et al. | 501/98.5 |
| 4,766,097 | 8/1988 | Shinozaki et al. | 501/98.4 |
| 4,833,108 | 5/1989 | Mizuno et al. | 501/98.4 |
| 4,847,221 | 7/1989 | Horiguchi et al. | 501/98.4 |
| 5,036,026 | 7/1991 | Yamakawa et al. | 501/98.4 |
| 5,085,923 | 2/1992 | Yamakawa et al. | 501/98.4 |
| 5,250,478 | 10/1993 | Ishida et al. | 501/98.4 |
| 5,376,601 | 12/1994 | Okawa et al. | 501/98 |
| 5,413,360 | 5/1995 | Atari et al. | 361/234 |

FOREIGN PATENT DOCUMENTS

| | | |
|---|---|---|
| 0 147 101 A2 | 7/1985 | European Pat. Off. . |
| 2 637 887 A1 | 11/1989 | France . |
| 7-19831 | 4/1988 | Japan . |
| 63-46032 | 9/1988 | Japan . |
| 2-22166 | 1/1990 | Japan . |
| 2 087 854 | 6/1982 | United Kingdom . |
| 2 108 949 | 5/1983 | United Kingdom . |

OTHER PUBLICATIONS

"ESR assessment method of materials", IPC Publishing, p. 57 (no date).

Hiroaki Ohya and Jun Yamauchi: "Electron Spin Resonance" published by Kodansha Co., Ltd. (no date).

*Primary Examiner*—Michael Marcheschi
*Attorney, Agent, or Firm*—Parkhurst & Wendel, L.L.P.

[57] ABSTRACT

In AlN crystal grains constituting a sintered body, is contained: 150 ppm–0.5 wt. %, preferably at most 0.1 wt.%, of at least one rare earth element (as oxide thereof); at most 900 ppm, preferably at most 500 ppm of at least one metal impurity except rare earth elements; and preferably at least 0.5 wt. % of oxygen measured by an electron probe X-ray microanalyzer. The grains have an average grain diameter of preferably at least 3.0 $\mu$m and show a main peak in the wavelength range of 350–370 nm of spectrum obtained by a cathode luminescence method. The sintered body composed of AlN crystal grains has a volume resistivity at room temperature of at most $1.0 \times 10^{12}$ $\Omega \cdot$cm.

19 Claims, 26 Drawing Sheets

FIG_1

FIG_2

FIG_3

FIG_4

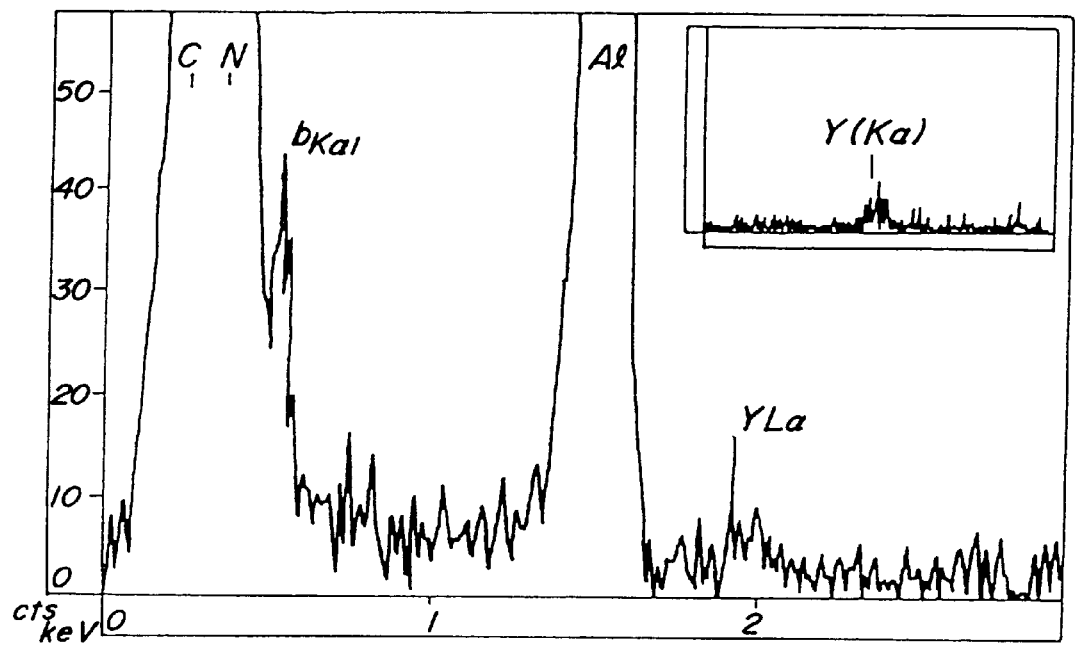
FIG_10
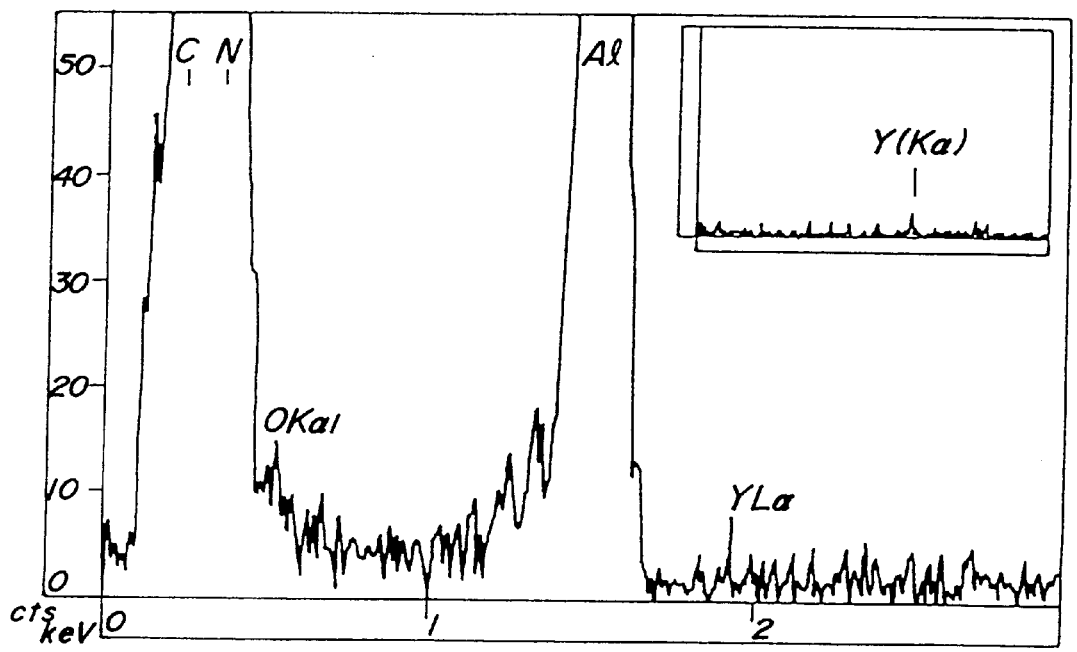
FIG_11

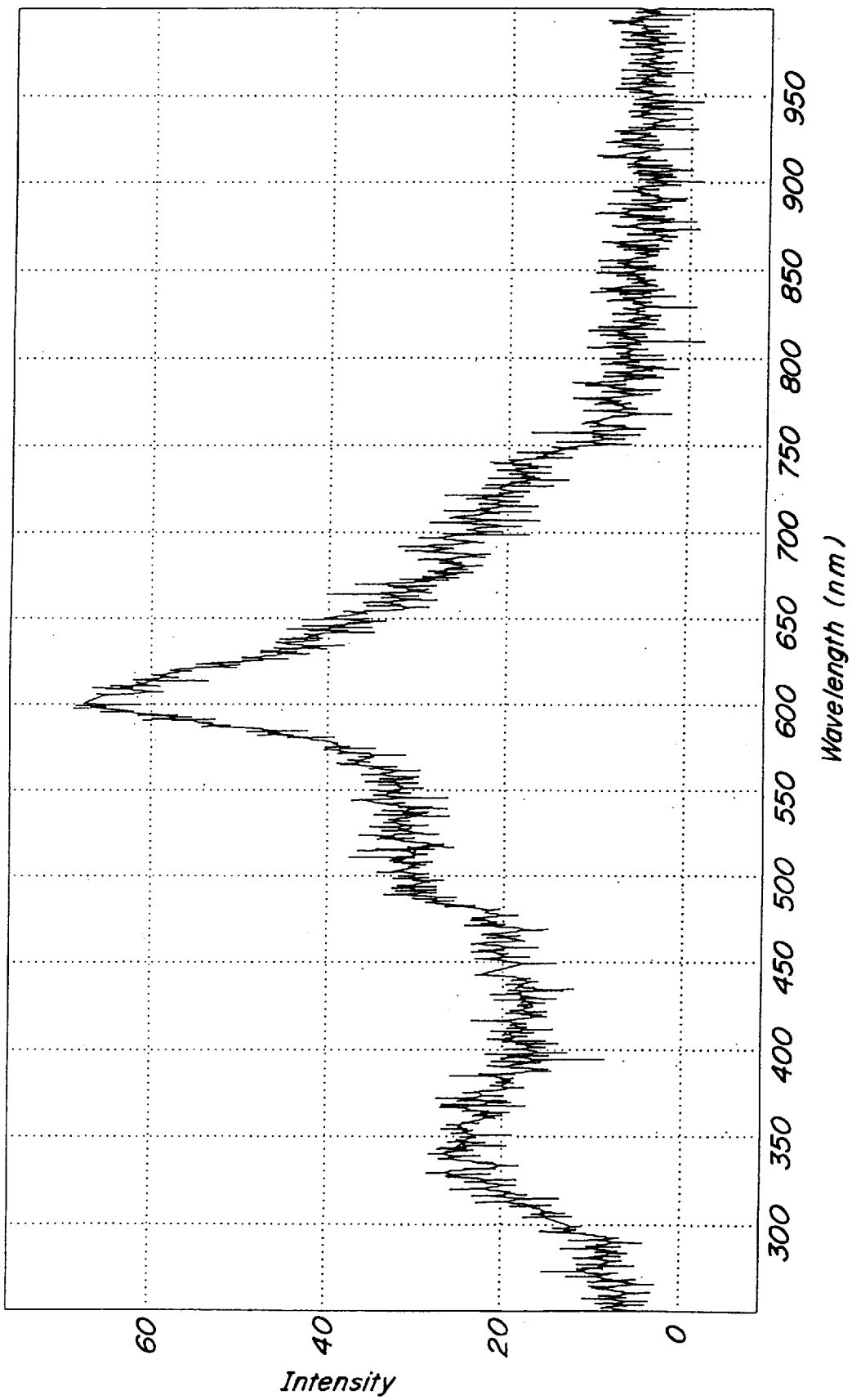
FIG_24

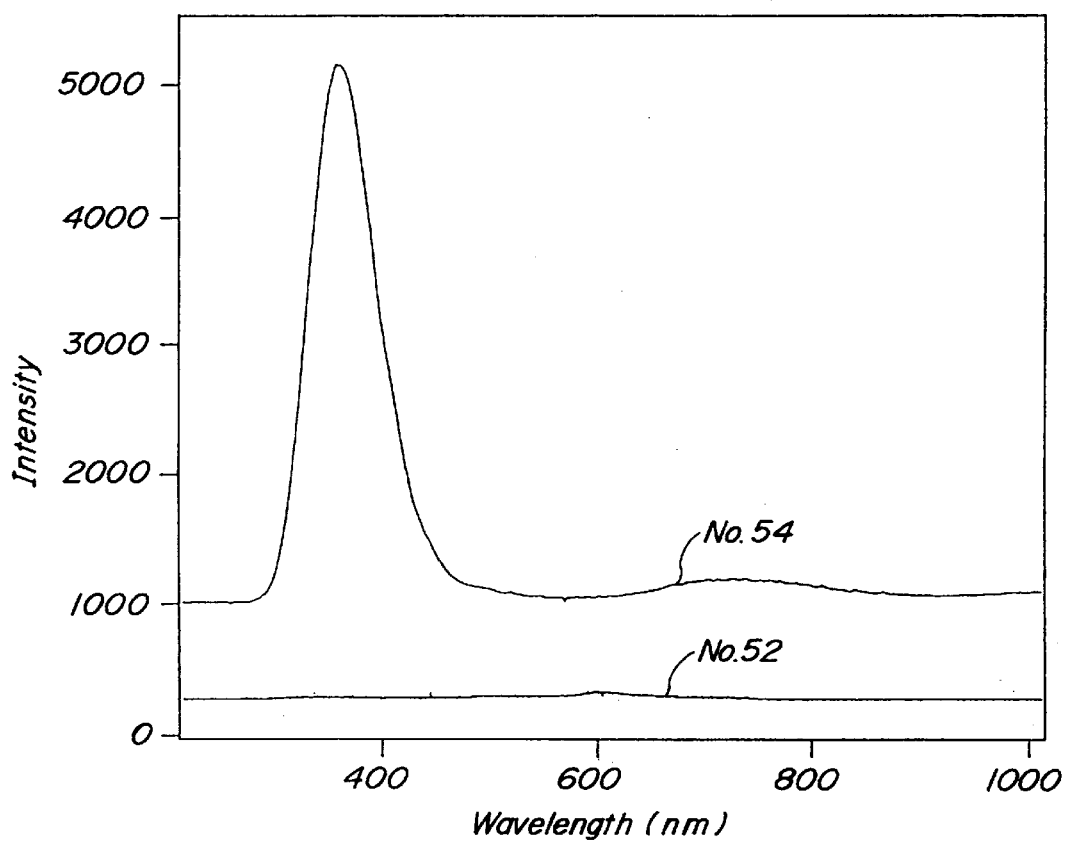
FIG_25

FIG_26
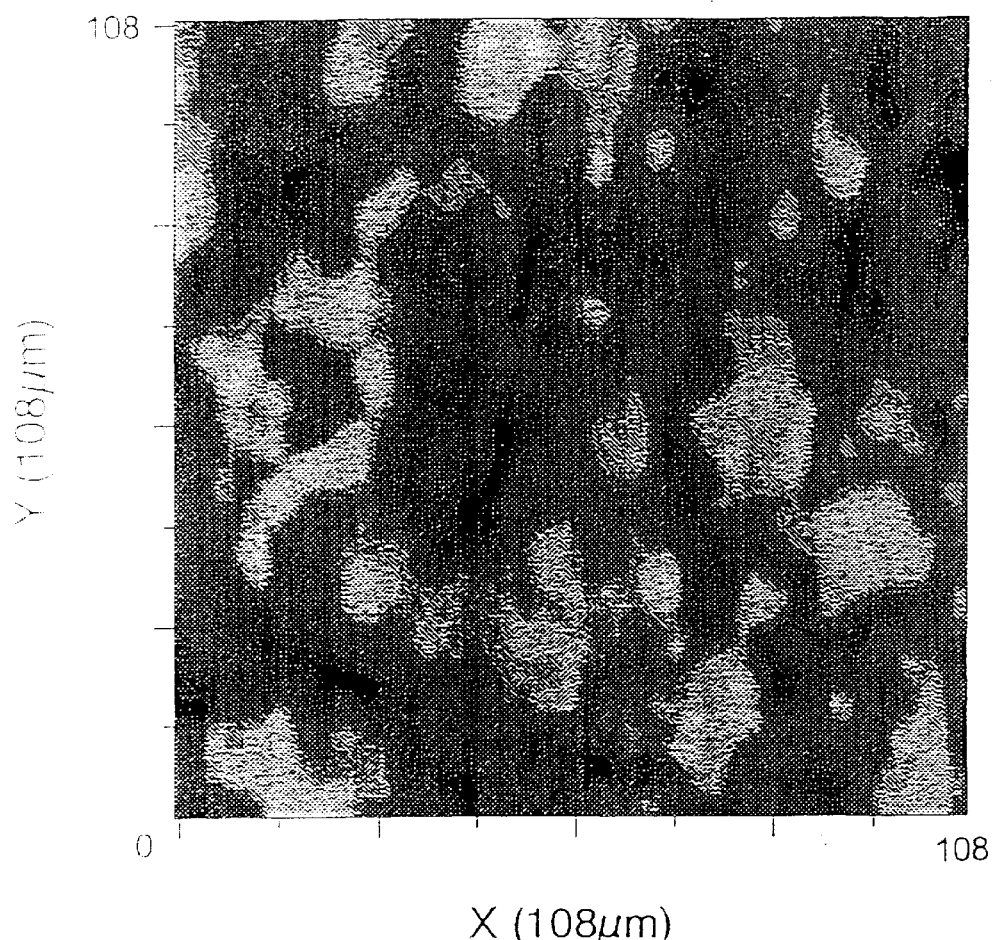
FIG_27
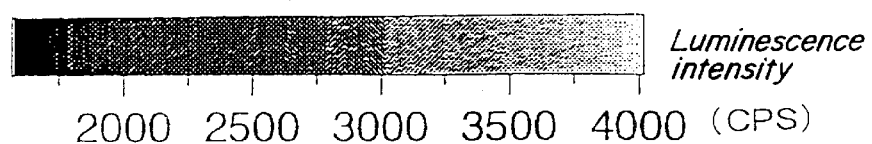
Luminescence intensity
2000 2500 3000 3500 4000 (CPS)

FIG_30a
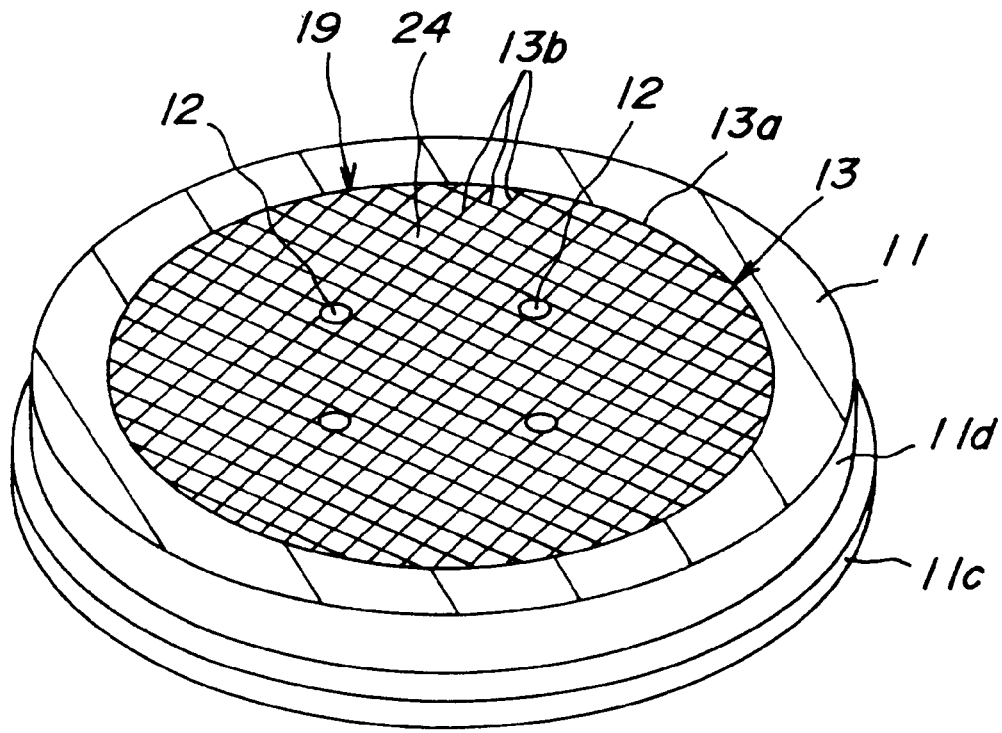
FIG_30b
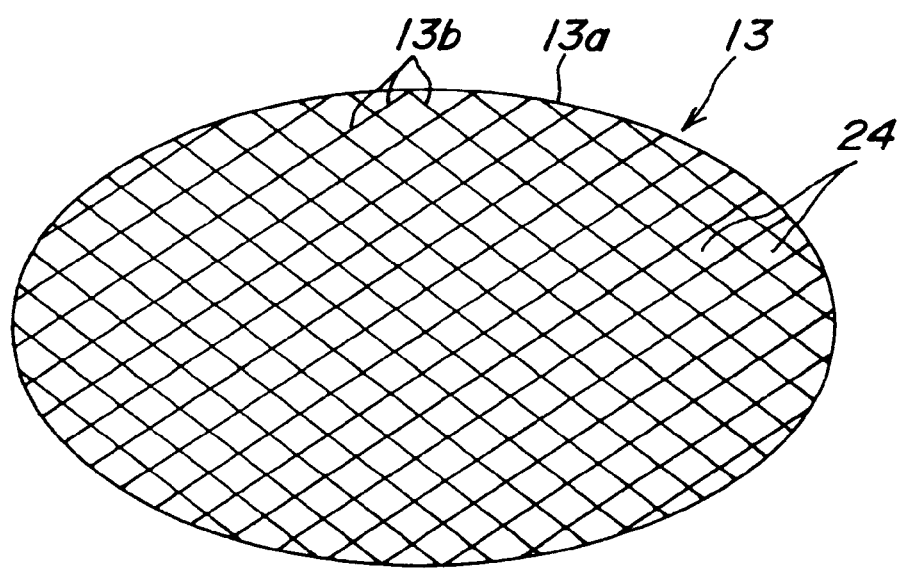

ALUMINUM NITRIDE SINTERED BODY, METAL EMBEDDED ARTICLE, ELECTRONIC FUNCTIONAL MATERIAL AND ELECTROSTATIC CHUCK

BACKGROUND OF THE INVENTION

1. Field of the Invention

The present invention relates to a novel aluminum nitride sintered body having a high purity and a low volume resistivity, and metal embedded articles, electronic functional materials and electrostatic chucks utilizing this aluminum nitride sintered body.

2. Description of Related Art

At present, in film forming processes comprising the steps of transferring, exposing to light, chemical vapor depositing, sputtering and the like, and in the succeeding steps of micromachining, washing, etching, dicing and the like, of a semiconductor wafer, electrostatic chucks are used for attracting and holding the semiconductor wafer. As a substrate of such electrostatic chucks, dense ceramics have been drawing attention. Particularly, in apparatuses for manufacturing semiconductors, halogenous corrosive gases such as $ClF_3$ and the like are frequently used as etching gases or cleaning gases. Moreover, in order that the semiconductor wafer is rapidly heated or cooled while being chucked, the substrate of the electrostatic chuck is desired to have a high thermal conductivity. It is further desired to have such a high thermal shock resistance that it may not fracture due to a rapid temperature change. A dense aluminum nitride has a high corrosive resistance against halogenous corrosive gases as mentioned above. Moreover, it has been known that such an aluminum nitride is a high thermal conductive material and its volume resistivity is not less than $10^{14}$ Ω·cm at room temperature. Further, it is also known that aluminum nitride has a high thermal shock resistance. Therefore, it is accounted preferable to form a substrate of an electrostatic chuck for semiconductor manufacturing apparatuses of an aluminum nitride sintered body.

On the other hand, in the semiconductor-manufacturing apparatuses, in order to use an electrostatic chuck as a susceptor for holding a semiconductor wafer, it is necessary to enhance the attracting force of the electrostatic chuck, and consequently it is necessary to decrease the specific resistance of the substrate. For example, in Japanese Patent Publication No. 7-19831, in order to increase the attracting force of the electrostatic chuck by decreasing the resistance of the insulating dielectric layer of the electrostatic chuck, an insulating material having a high volume resistivity is incorporated with a conductive or semiconductive material to adjust the resistivity of the insulating dielectric layer to not more than $10^{13}$ Ω·cm. Moreover, in Japanese Patent Laid-Open Publication No. 2-22166, ceramics starting materials containing alumina as a main component are fired in a reducing atmosphere to produce dielectric ceramics for electrostatic chucks. In this case, the ceramic starting material is made to contain an alkali earth metal and a transition metal in amounts as oxide of 1–6% and 0.5–6%, by weight, respectively. In this method, for example, it is intended to increase the dielectric constant, concurrently decreasing the volume resistivity to $10^{12}$–$10^{18}$ Ω·cm, by incorporating $TiO_2$ with the alumina ceramics, thereby to obtain a high attracting power.

However, according to such a method, there will be posed problems such that products produced by corrosion of alkali earth metals and transition metals yield particles.

However, highly purified aluminum nitride sintered bodies are not suited for forming a substrate of electrostatic chucks for semiconductor-manufacturing apparatuses, because of such a high volume resistivity thereof as at least $10^{14}$ Ω·cm. In order to provide them with a sufficient attracting force, it is necessary to form an extremely thin insulating dielectric layer, 300 μm thick or less. However, it has been found that when such a thin insulating dielectric layer contacts with halogenous corrosive gas or plasma, during its long time use, there is a possibility of causing an insulation breakdown and the like occurring from a starting point on any of reactant layers on the surface of the insulating dielectric layer. From this point of view, it has been found that the insulating dielectric layer is preferred to be 500 μm thick or more.

However, in conventional electrostatic chucks made of an aluminum nitride sintered body, such a thick insulating dielectric layer results in decrease of the attracting force of the electrostatic chucks. Particularly in a low temperature region where a volume resistivity is high, it has been difficult to provide a sufficient attracting force. Particularly, it is at a low temperature of from −50° C. to −60° C. that dry etching processes are conducted, and it is at relatively a low temperature of around 100° C. that highly densified plasma CVD processes are conducted. Therefore, in such low temperature processes, it has been difficult to constantly provide a predetermined attracting force.

For this reason, the present inventors have restudied the aluminum nitride sintered bodies per se.

For example, in an electrostatic chuck comprising an aluminum nitride substrate, the effect of adding a low resistivity material to the aluminum nitride substrate was studied according to the description in Japanese Patent Publication No. 7-19831. By this method, the volume resistivity of the aluminum nitride sintered body was able to be reduced to not more than $10^{13}$ Ω·cm. However, with this electrostatic chuck, there is a possibility of causing pollution to semiconductor by separation of the added low resistant metal or the like from the surface of the substrate.

Alternatively, it has been proposed to improve a thermal conductivity as well as a density of aluminum nitride by adding an oxide or carbonate of a rare earth element such as yttrium or the like, as a sintering assistant, to an aluminum nitride starting material (Japanese Patent Publication No. 63-46032). Using such a sintering assistant, dense aluminum nitride sintered bodies can be manufactured even by a normal pressure sintering method. However, such aluminum nitride sintered bodies have a high volume resistivity, and even those of about 99% relative density have a volume resistivity on a level of $10^{13}$–$10^{15}$ Ω·cm.

SUMMARY OF THE INVENTION

It is, therefore, an object of the present invention to provide a novel aluminum nitride sintered body having a high purity and a low volume resistivity.

It is another object of the present invention to provide a novel electronic functional material comprising such an aluminum nitride sintered body and having a volume resistivity on the same level as that of semiconductors, and an electrostatic chuck using such an aluminum nitride sintered body.

According to the first aspect of the invention, there is the provision of an aluminum nitride sintered body characterized by comprising rare earth element(s) in a total amount (as oxide thereof) of 150 ppm–0.5%, by weight, and at least one metal impurity except rare earth elements in a total amount of not more than 900 ppm, and having a main peak within a wavelength region of from 350 nm–370 nm in a spectrum obtained by a cathode luminescence method.

Further, according to the second aspect of the invention, there is the provision of an aluminum nitride sintered body characterized by comprising rare earth element(s) in a total amount (as oxide thereof) of 150 ppm–0.5%, by weight, at least one metal impurity except rare earth elements in a total amount of not more than 900 ppm, and constituent aluminum nitride crystal grains having an oxygen concentration of 0.50%–2.00%, by weight, measured by an electron probe X-ray microanalyzer.

Further, according to the third aspect of the invention, there is the provision of an aluminum nitride sintered body characterized by comprising rare earth element(s) in a total amount (as oxide thereof) of 150 ppm–0.5%, by weight, and at least one metal impurity except rare earth elements in a total amount of not more than 900 ppm, and having a g-value of an unpaired electron of not more than 2.000 in a spectrum of the aluminum nitride sintered body obtained by an electron spin resonance method.

Further, according to the fourth aspect of the invention, there is the provision of an aluminum nitride sintered body characterized by comprising rare earth element(s) in a total amount (as oxide thereof) of 150 ppm–0.5%, by weight, and at least one metal impurity except rare earth elements in a total amount of not more than 900 ppm, and having a spin amount obtained from a spectrum measured by electron spin resonance method of at least $1 \times 10^{13}$ spins per unit mg of aluminum.

Further, according to the fifth aspect of the invention, there is the provision of an aluminum nitride sintered body characterized by comprising rare earth element(s) in a total amount (as oxide thereof) of 150 ppm–0.5%, by weight, at least one metal impurity except rare earth elements in a total amount of not more than 900 ppm, and constituent aluminum nitride crystal grains having an average grain diameter of at least 3.0 μm, and said aluminum nitride sintered body having a volume resistivity of $1.0 \times 10^6$–$1.0 \times 10^{12}$ Ω·cm.

Further, according to the sixth aspect of the invention, there is the provision of a metal embedded article comprising one of the aforesaid aluminum nitride sintered bodies and a metal member embedded therein. This aspect further provides an electronic functional material comprising one of the aforesaid aluminum nitride sintered bodies.

Furthermore, according to the seventh aspect of the invention, there is the provision of an electrostatic chuck having an attracting surface for attracting and holding a semiconductor, which comprises a substrate comprising one of the aforesaid aluminum nitride sintered bodies, a plate-type electrode embedded therein, and a power source for supplying the plate-type electrode with a direct current power.

The present inventors, in the course of manufacture of an aluminum sintered body containing not more than 900 ppm of at least one metal impurity other than rare earth elements, have surprisingly succeeded in providing an aluminum nitride sintered body with a volume resistivity of not more than $1 \times 10^{12}$ Ω·cm by adjusting the content of the rare earth elements (as oxides thereof) in the sintered body to not more than 0.5% by weight, and preferably making the sintering to proceed so that constituent aluminum nitride crystal grains may have an average grain diameter of at least 3.0 μm. The reason for such a result is not clear, but it can be conjectured as follows:

As a basic way of thinking, the resistance of aluminum nitride sintered bodies can be calculated as a resistance of a circuit formed by connecting aluminum nitride crystal grain resistances with grain boundary resistances in series and parallel. The present inventors have accelerated densification of a sintered body, by employing aluminum nitride particles with high purity, admixing a small amount of a rare earth element therewith, and applying a high pressure by means of hot pressing or the like.

In this case, if the rare earth element compound is admixed in an amount of more than 0.5% by weight, oxygen existing in the starting particles diffuses towards the outside of the particles during firing. In contrast therewith, according to the present invention, by adjusting the amount of the rare earth element compound to small, and applying a high pressure during sintering, the oxygen is made to remain in aluminum nitride crystal grains in the state of solid solution. This oxygen in the crystal grains replaces nitrogen atoms in AlN, to form a donor level in a band gap, with the consequence that the electron conductivity in the grains is improved. As mentioned above, the oxygen solid-solution in aluminum nitride crystal grains is essential for decreasing the resistance of each crystal grain.

Conventionally, rare earth elements such as yttrium or the like have been incorporated, as a sintering assistant, with aluminum nitride sintered bodies in an amount as oxide thereof of several percent by weight (Japanese Patent Publication No. 63-46032). If this amount is positively decreased, a dense body becomes hardly obtainable in normal pressure sintering. Besides, a study has been conducted to improve a thermal conductivity of aluminum nitride sintered bodies by increasing the amount of these sintering assistants to be added. That is to say, it has been a common sense to add about several % by weight of a sintering assistant in order to decrease porosity and increase thermal conductivity of aluminum nitride sintered bodies.

Further, the starting powder of aluminum nitrides contains oxygen within the particles thereof. The oxygen existing in the inside of each particle diffuses towards the outside of the particles by virtue of an action of the sintering assistant during sintering. It has been assumed that the thermal conductivity is more improved with progressing process of discharging the oxygen from the aluminum nitride particles.

Namely, it has been considered that the oxygen atoms are a kind of impurities which remain in the aluminum nitride crystal grains even after sintering. Accordingly, a study to decrease the amount of oxygen remaining in the grains has been conducted in order to improve the thermal conductivity of sintered bodies. From another point of view, a study for utilizing aluminum nitride sintered bodies as a material having a volume resistivity in the region of semiconductors has not been heretofore conducted.

In contrast, according to the present invention, the amount of the oxygen remaining in grains after pressure sintering, is controlled by adjusting the amount of the rare earth element compound blended and increasing the pressure during sintering, with the consequence that the oxygen is made to remain as a donor for decreasing the resistance of each crystal grain. It is an utterly novel concept that the oxygen remaining in crystal grains after sintering is used as a donor, in order to decrease the volume resistivity of aluminum nitride sintered bodies to the same level as semiconductors.

The content of the rare earth element(s) in aluminum nitride sintered bodies is necessary to be not more than 0.5% by weight as oxide thereof. If it exceeds 0.5% by weight, the oxygen existing in crystal grains diffuses toward the outside of the grains during sintering. If the oxygen is thus purged out and the interior of the grains is purified, the thermal conductivity is increased by virtue of decrease of phonon scattering with decreasing oxygen, but the resistance of each grain is also increased. Further, rare earth elements remaining at boundaries and triple points of each aluminum nitride crystal grain form an intergranular phase. This intergranular phase disorders the crystal lattice near the grain boundary of each aluminum nitride crystal grain adjacent to others, and loosens adhesion between crystal grains. It is considered that the decrease of the volume resistivity of the sintered body has so far been impeded by such disordering at each grain boundary of crystal grains. In the aluminum nitride sintered bodies according to the present invention, even the disorder of atom arrangement at the aluminum nitride crystal grain boundary can be hardly seen.

From this point of view, the volume resistivity of the sintered bodies can be more lowered by decreasing the content of the rare earth elements to not more than 0.1% by weight.

It is necessary that the content of the rare earth elements in the sintered body is made to be not less than 150 ppm. It has been found that if it is made to be not less than 300 ppm, the decrease of the volume resistivity becomes particularly noticeable. From this point of view, the content of the rare earth elements in the sintered body is more preferred to be not less than 300 ppm.

Particularly for use in semiconductor processes, alkaline metals and transition metals which are regarded as impurities in these processes are not preferred. Further, it is considered that metal impurities except rare earth elements are present inside the grains or at grain boundaries and function to increase an in-grain resistance or grain boundary resistance.

Further, in the present invention, it is necessary to employ starting materials with high purity, more concretely, the content of metal impurities except rare earth elements must be restricted to not more than 900 ppm. If it exceeds 900 ppm, the tendency to increase the volume resistivity of the sintered body is shown as conceived. Since these metals are included as impurities, it is preferred to be as small an amount as possible. Accordingly, the amount of the metal impurities except rare earth elements is preferred to be not more than 500 ppm, more preferably not more than 100 ppm, including 0 ppm to below a detectable limit.

Further, the average grain diameter of the aluminum nitride crystal grains in the sintered bodies is preferred to be not less than 3.0 $\mu$m, more preferably not less than 4.0 $\mu$m, and most preferably not less than 5.0 $\mu$m.

If the average grain diameter of the crystal grains increases, the number of the crystal grain boundaries per unit length of the conduction path in the sintered body decreases. In general, the resistance of the crystal grain boundary is larger than that in the crystal grains, for example, in the case where the sintering temperature is increased to grow crystals, a tendency to decrease volume resistivity thereof is shown. It is important to decrease the number of the grain boundaries per the number of the grains, in order to decrease the volume resistivity of the sintered body. Therefore, if the crystal grains have grown to have an average grain diameter only up to less than 3.0 $\mu$m, since the frequency of the grain boundaries per conduction path increases, the resistivity of the sintered body also increases.

There is no particular upper limit in the average diameter of the aluminum nitride crystal grains, it is generally preferred to be not more than 20 $\mu$m.

Further, the aluminum sintered bodies are preferred to have a relative density of not less than 98.5%, whereby the volume resistivity of the sintered bodies is further decreased. From this point of view, the relative density of the sintered body is preferred to be not less than 99.0%, more preferably not less than 99.6%.

As mentioned above, in the present invention, the aluminum nitride sintered bodies are required to be extremely densified, and at the same time, the amount of the rare earth elements added is decreased to such an amount that the rare earth elements substantially may not act as a sintering assistant. At the same time, the amount of other metal elements to be added which is functionable to promote sintering is required to be decreased to the utmost as mentioned above. Under such a condition, generally only a relative density of not more than 90% can be obtained by means of normal pressure sintering.

Therefore, in order to obtain the aluminum sintered bodies according to the present invention, it is necessary to employ a press sintering process such as a hot press process and a hot isostatic press process, whereby the aluminum nitride sintered bodies can be densified without requiring any sintering assistant.

Thus, one of the principal points of the present invention is that a mechanical pressure is also applied during firing. For example, according to the conventional concept, the hot press process has been understood as a process for applying a mechanical pressure for promoting densification of sintered bodies.

However, in the present invention, it is not only for promoting densification of sintered bodies. Namely, under a high temperature condition during firing, there is a possibility such that the electron state of the aluminum nitride crystal grains or grain boundaries is interfered synergistically with small amounts of rare earth elements having existed at the surface of the aluminum nitride grains from prior to firing, which would not occur in a normal pressure sintering. It is assumed that such an interference controls the arrangement of aluminum atoms and nitrogen atoms at the boundaries of adjacent crystal grains and thus decreases the resistance at the grain boundaries. It is highly possible that the above causes the decrease of the resistance at the grain boundaries, and also may effect in decrease of the in-grain resistance.

The thus obtained aluminum nitride sintered bodies according to the present invention surprisingly have a volume resistivity in the range of $1 \times 10^{12}$–$1 \times 10^6$ $\Omega \cdot$cm, particularly not more than $1 \times 10^{11}$ $\Omega \cdot$cm, and more particularly not more than $1 \times 10^{10}$ $\Omega \cdot$cm. Such a range of the volume resistivity belongs just in the region for semiconductors. The present invention, in highly pure aluminum nitride sintered bodies including very small amounts of metal impurities and rare earth elements, first provides a sintered body having a volume resistivity of semiconductor region. In this respect, the present invention is epoch-making.

Further, the aluminum nitride sintered bodies have hitherto been studied as an electrically insulating material with a high thermal conductivity. Furthermore, an attempt has been made to decrease the resistance by doping aluminum nitride sintered bodies with an electric conductor or semiconductor. However, a study has not been conducted to decrease the resistance of the aluminum nitride crystal grains per se, like the present invention.

The present inventors have further investigated boundaries of each crystal grains, and have searched into the reason for the drastic decrease of the volume resistivity of the sintered body. First, in the case where no rare earth element was added as described above, the volume resistivity of the sintered body was not so decreased as the case of the present invention, and rare earth elements did not form solid-solution in the crystal grains, so that it is conjectured that if a very small amount of rare earth elements existed in the boundaries of adjacent crystal grains, the resistance at the crystal grain boundaries could be decreased.

In fact, the present inventors have found by each measuring method as mentioned below that rare earth elements substantially do not exist within the aluminum nitride crystal grains, but are present in the boundary of two aluminum nitride crystal grains adjacent to one another. In this specification and claims, that the phrase "rare earth elements substantially do not exist in crystal grains" should be understood to mean that there is shown no peak corresponding to rare earth elements by means of EDS (Energy Dispersive X-ray Spectrometer).

It has been found that the rare earth elements exist in the grain boundary of adjacent two aluminum nitride crystal grains but do not form a crystalline phase, and are present in the grain boundary between crystal grains on an atomic level. And it has been found that in the grain boundary of adjacent two aluminum nitride crystal grains, the disordered portion of the crystal lattices composing each aluminum nitride crystal grain can hardly been observed, and that the width of this portion is not more than 5 nm, particularly not more than 1 nm. In some measured samples, such a disorder of the crystal lattices at interfaces of the grains substantially could not be observed. It is conjectured that the resistance between crystal grains is extremely decreased, because of such a specific microstructure at the grain boundary of the crystal grains.

Further, the present inventors have investigated the triple point (triple point formed by three aluminum nitride crystal grains) in the aluminum nitride sintered bodies, and found that the crystalline phase at the triple point substantially does not contain rare earth elements. From this result, it is conjectured that the rare earth elements exist, as an extremely thin amorphous phase, near the surface or on the surface of each aluminum nitride crystal grain. Even at the triple point, it has been found that rare earth elements exist only near the surface or on the surface of the crystal grains.

From these results, it has been elucidated why the volume resistivity is extremely increased in the case where much metal impurities except rare earth elements are included. It is because that such a metal atom impurity forms solid-solution within the aluminum nitride crystal grains or exists in the grain boundaries, and such crystal grains or grain boundaries are considered to have a high resistance.

Further, the difference between a total oxygen content in an aluminum nitride sintered body and an oxygen content in the assumed oxides of rare earth elements is preferred to be not less than 0.5% by weight. This difference represents the content of the oxygen remaining in the aluminum nitride crystal grains. By increasing this up to not less than 0.5% by weight, the resistance of the crystal grains per se can be decreased, whereby the volume resistivity of the whole sintered body also can be extremely decreased. However, the upper limit is 2.0% by weight.

The present inventors have taken spectra by means of an electron spin resonance method (ESR method) with respect of each sample of the aluminum nitride sintered bodes having a low volume resistivity according to the invention, in order to study the constitution of the defect structure of inside the crystalline phase and at the grain boundary. This principle will be explained briefly. Under a magnetic field, an energy level of unpaired electrons is split due to the Zeeman's effect. To these energy levels sensitively react an orbit movement of electrons and a mutual action of neighboring electrons with a nuclear magnetic efficiency. In the ESR method, it is possible to obtain information about atoms, chemical coupling or the like in the vicinity of an atom having the unpaired electrons, by measuring the split energy levels.

In the aluminum nitride, the g-value of the unpaired electrons of aluminum varies corresponding to a crystal field where the unpaired electrons exist. This g-value is 2.0000 theoretically in a free electron, and 2.002316 after a relativistic correction. The Al atom and N atom in the aluminum nitride crystalline phase have a wurtzite structure with four coordinations. Therefore, an $Sp^3$ hybridized orbit is constructed by one aluminum atom and three nitrogen atoms. It is possible to know, from the g-value of each sample, what crystal coordination that unpaired electrons in the lattice defects exist in or what kind of elements exist around the unpaired electrons.

From this result, it has been proved that in the aluminum nitride sintered bodies according to the present invention, the g-value of the unpaired electrons of the aluminum in a spectrum by means of ESR method is not more than 2.000.

If the kind of atoms coupled with an Al atom having unpaired electrons is varied, the g-value will be largely varied. The cause for resulting such a low g-value as the above is attributable to a variation of the kind of atoms coupled with the aluminum. In a Si atom having a four coordinate structure, it has been reported that the same variation of the g-value as the above occurs (see: "ESR assessment method of materials", IPC Publishing, page 57). This reason is conjectured to be due to an influence of oxygen atoms remaining in aluminum nitride crystal grains.

It has also been found that the spin amount per unit mg of aluminum obtained from a spectrum by means of ESR method is not less than $1 \times 10^{13}$ spin. The measuring method was according to the method described in Hiroaki Ohya and Jun Yamauchi: "Electron Spin Resonance" published by Kodansha Co., Ltd. That is, the absorption intensity in ESR spectra is proportional to the percentage of unpaired electrons in the aluminum nitride crystal grain. The quantitative determination of the g-value needs to be conducted comparing with a standard sample having a known g-value. Namely, it is necessary that the sample having a known g-value and the sample of the aluminum nitride sintered body according to the present invention are measured under the same condition, absorption curves obtained are converted into integral curves, and then areas defined by the integral curves are compared with each other.

The present inventors quantitatively determined a single super fine line of $Mn^{2+}/MgO$ by using a solution of TEM-POL (4-hydroxy-2,2,6,6-tetramethylpyperidine-1-oxyl) having a known spin amount, compared the spin amount with the line, and calculated the spin amount per unit mg of the aluminum nitride sintered body from an area ratio of peaks.

In order to estimate the state of the electrons in the band gap affecting on the electric property of the aluminum nitride sintered body and further clarify the feature of the present invention, the inventors measured a cathode luminescence spectrum.

A cathode luminescence is generally a kind of reflection waves from a sample when it is irradiated with an electron ray. As shown in FIG. 1 as a schematic view, if an excited electron exits from a valence band to a conduction band, a positive hole is formed in the valence band. Then, luminescence corresponding to a band gap between the valence band and the positive hole in the valence band is emitted. In addition, in the case where a local electron level other than the conduction band is generated by a function of defects or impurities included in the crystal, luminescence is emitted by virtue of re-coupling of excited electrons in the local electron level with the positive holes in the valence band. Therefore, it is possible to obtain information about an energy band structure, a crystal property and defects and impurities included in the crystal from the cathode luminescence spectrum.

A cathode luminescence spectrum of the sintered body according to the present invention was measured. As the result, as shown in FIGS. 23 and 25, it was found that a strong main peak existed in the wavelength range of 350–370 nm. Further, a weak peak, which was assumed as a double multiple wave of the main peak, was detected in a wavelength range of 650–750 nm.

Further, as a comparative object, a highly densified sintered body was prepared by admixing an aluminum nitride powder with 5% by weight of yttria powder and firing. With respect to this sintered body, a cathode luminescence spectrum was measured. As the result, for example, as shown in FIGS. 24 and 25, weak peaks were observed at wavelengths of about 340 nm, 500 nm and 600 nm, respectively.

Such a difference in the wavelength of luminescence represents a difference of kinds of luminescence i.e. an electron level in the band gap. Alternatively, a difference in intensity of luminescence shows a difference of electron density due to impurities. That is, in the sintered body according to the present invention, a very strong and sharp peak was observed in the wavelength range of 350–370 rm. This shows existence of a very strong new electron level and a high electron density due to a particular impurity.

Then, the inventors conducted a cathode luminescence two-dimensional mapping with respect to luminescence of 360 nm wavelength, in order to specify whether an electron level generating a strong main peak in the wavelength range of 350–370 nm exists in aluminum nitride crystal grains in the sintered body or in the intergranular phase of the crystal grains.

Then, the result of this mapping was compared with a scanning electron photomicrograph with respect to the same view field of the same sample. It was proved that a very strong luminescence of 360 nm wavelength by cathode luminescence existed in the aluminum nitride crystal grains. On the other hand, grain boundary portions were dark, and the above mentioned luminescence could not be seen. This shows that regions of high electron density i.e. regions of high local electron level, are distributed within the grains and not in the intergranular portions. From this result, it has been found that the electric property of the crystal grains per se has a strong influence upon the volume resistivity of the sintered body.

Further, distribution of oxygen density was measured by means of an electron probe X-ray microanalyzer (EPMA) with respect to the sintered bodies of the present invention. As the result, it has been found that in the sintered bodies of the present invention, a relatively large amount of oxygen forms solid-solution in the grains.

In the sintered bodies of the present invention, it is assumed that a relative large amount of oxygen forms solid-solution in the aluminum nitride crystal grains, and this provides the local electron level and contributes to decreasing the in-grain resistances. This is in accordance with the high intensity of the absorption peak on the ESR spectrum.

Concretely, as a result of determination of the oxygen concentration in the aluminum nitride crystal grains constituting the sintered bodies according to the invention, it has been found that a concentration of not less than 0.5%, preferably not less than 0.6%, by weight, is required. It has no particular upper limit, but it is preferred to be not more than 2.0%, more preferably no more than 1.0%, by weight.

In summarizing the experimental results mentioned above, it is conjectured that the electric resistance of crystal grains may be decreased according to the following process. Namely, when oxygen forms solid-solution in aluminum nitride crystal grains, the oxygen replaces nitrogen at a nitrogen lattice site. In this case, because of a compensation of an electric charge between nitrogen $N^{3-}$ and oxygen $O^{2-}$, a conductive electron (donor) or a vacancy is formed in the aluminum lattice, which influences largely upon the electric conductivity. It is considered that the formation of such conductive electron or vacancy in the lattice decreases internal electric resistance of the aluminum nitride crystal grains and largely contributes to decrease the electric resistance of the sintered body.

The present inventors also determined the distribution of the oxygen concentration by means of electron probe X-ray microanalyzer (EPMA) with respect to a comparative object sintered body admixed with 5% by weight of yttria. As the result, in the case of the sintered body admixed with 5% by weight of yttria, the internal oxygen concentration of the crystal grains was decreased relatively. Moreover, it has been found that a portion including relatively much oxygen almost overlaps a portion containing yttria. It has been known that yttria does not form solid-solution in aluminum nitride grains and is discharged to intergranular portions. Accordingly, most oxygen atoms are not present in the grains but at grain boundaries.

Therefore, in the course of sintering progress, the yttrium is discharged from the grains, when the yttrium shows a tendency to entrain oxygen atoms towards grain boundaries. Therefore, it is considered that oxygen atoms in the grains have been decreased.

Next, a method for producing the sintered bodies according to the present invention will be explained. As an aluminum nitride starting powder, the powder obtained by a direct nitriding method as well as a reductive nitriding method can be used. At present, the powder by the reductive nitriding method is more preferred, since this method readily yields a powder having a low metal impurity content. However, even the powder obtained by a direct nitriding method can be used with no problem, if the purity of aluminum raw materials is improved and inclusion of impurities is prevented in each step of the manufacturing process.

In the finally resulting sintered bodies, since the difference between the total oxygen content in the aluminum nitride sintered body and the oxygen content in oxides of rare earth elements is preferred to be not less than 0.5% by weight, the oxygen content in the starting powder is rather important. When the oxygen content in the starting powder is low, a post-treatment for introducing oxygen into the starting powder becomes required. For example, the oxygen content in the starting powder can be increased by an oxidation treatment in which the starting powder is heated at a temperature of 400–800° C. in oxidative atmosphere such as air. Alternatively, the starting powder can be admixed with various kinds of alumina powder or an alumina precursor.

Finally, the difference between the total oxygen content in the aluminum nitride starting powder and the oxygen content in oxides of rare earth elements before subjecting to caramelizing and firing steps is preferred to be not less than 0.5% by weight.

However, in order to uniformly disperse oxygen atoms in each aluminum nitride crystal grain which constitutes a sintering body, it is preferred to make the oxygen content in the starting powder sufficiently high as mentioned above on the stage where the starting powder has been produced, without conducting the post-treatment as mentioned above.

Further, the above starting powder can be admixed with rare earth elements in various forms. For example, the aluminum nitride starting powder can be admixed with powder of a simple substance or a compound of rare earth elements.

Generally, oxides of rare earth elements are most readily available. However, in the case where oxides of rare earth elements are employed, the amount of the adding rare earth elements is very small in the present invention and, therefore, if dispersibility of the oxides of rare earth elements is insufficient, it will be difficult to uniformly disperse the rare earth elements over the whole sintered body, whereby various properties such as volume resistivity or the like in each portion of the sintered body are caused to vary.

Therefore, in the present invention, compounds such as nitrates, sulfates, alkoxides or the like of rare earth elements are dissolved in an appropriate solvent in which these compounds are soluble, to thereby obtain solution and this solution can be admixed with the aluminum nitride starting powder. Thereby, even if the rare earth elements are added in a trace amount, the rare earth elements are uniformly dispersed to every portion in the sintered body. Moreover, since it is most probable that rare earth elements are dispersed on the surface of each grain as a very thin layer, the high resistant rare earth element compounds become difficult to precipitate partially. If dispersion is insufficient, it may occasionally happen that the crystals comprising rare earth elements are precipitated locally. A small ratio of precipitates will not influence upon the above requirements.

When a dry press shaping process is employed, a spray dry process can be proposed as a process for drying the aforementioned starting powder. This process is particularly preferred as an instant drying process for compounds of rare earth elements as a trace additive.

Alternatively, a tape shaping process may be employed. In this case, solution obtained by dissolving compounds such as nitrates, sulfates and alkoxides or the like of rare earth elements may be added as an additive into a conventional tape shaping step. Because of very small loads, there will be no influence upon the shapability and dewaxability.

In a blending stage, an aluminum nitride starting powder is dispersed in a solvent, with which can be admixed rare earth element compounds in the form of oxide powder or solution as mentioned above. The mixing may be conducted by simple stirring. However, in the case where pulverization of aggregates in the starting powder is required, mixing pulverizing machines such as pot mill, trommel, attrition mill or the like may be employed. In the case where an additive soluble in a solvent for pulverization is employed, the time for conducting the mixing and pulverizing steps may be the shortest time required for the pulverization of the powder. Besides, binders such as polyvinyl alcohol or the like may be added.

A spray dry process is preferred for the step of drying the solvent for pulverization. Alternatively, after conducting a vacuum drying process, it is preferred to adjust the grain size by passing the dry powder through a sieve.

In the powder shaping step, when a disc-type shaped body is manufactured, a mold pressing process may be employed. A shaping pressure is preferred to be not less than 100 kgf/cm$^2$, and, however, it is not particularly limited, as far as the mold can be maintained. The hot press mold also can be loaded with a shaping material in a powdery form.

When a binder is admixed with a shaped body, the dewaxing may be conducted at a temperature of 200–800° C. in an oxidative atmosphere prior to firing.

In the case where an additive containing rare earth elements in the form of nitrates, sulfates and carbonates is added, denitrification, desulfurization and decarboxylation may be conducted for the starting powder or powdery shaped body, prior to firing. Such a degassing step may be conducted by heating the abovementioned starting powder or powdery shaped body under oxidative atmosphere, like the dewaxing step. In this case, it is necessary, however, to pay attention to damage of furnaces by NOx gases, SOx gases and the like.

Alternatively, the degassing may be conducted during firing, without conducting separately the degassing step such as denitrification, desulfurization, decarboxylation or the like.

Then, the shaped body is fired by means of a hot press process. The pressure in the hot pressing is required to be not less than 50 kgf/cm$^2$, preferably not less than 200 kgf/cm$^2$. There is no particular upper limit. However, in order to prevent the damage of the furnace, it is preferred to be not more than 1,000 kgf/cm$^2$, more preferably not more than 400 kgf/cm$^2$ from a practical point of view.

When the pressure is increased, it is possible to increase up to a maximum pressure all at once. However, it is particularly preferred to increase the pressure stepwise as the temperature rises, in order to improve the precision of the sintered body.

When a disc-type shaped body is fired by means of a hot press process, it is preferred to receive the shaped body in a sleeve having an inside diameter slightly larger than the outside diameter of the shaped body.

When degassing is required in the temperature increasing step, it is preferred to promote exhalation of gases by heating under vacuum in the temperature range from room temperature to 1,600° C.

Additionally, it is preferred to increase the temperature at a temperature increasing rate from between 50° C. hour and 1,500° C./hour up to a maximum temperature in firing. The maximum temperature is preferred to be 1,750–2,300° C. If the maximum temperature exceeds 2,300° C., aluminum nitride begins to decompose. If the maximum temperature is less than 1,750° C., the effective grain growth is restrained, and the average grain diameter will not reach 3 μm.

Further, as regards the time for sintering the shaped bodies, with the maximum temperature in the range from 1,850° C. to less than 1,900° C., the sintering was required to be conducted for at least 3 hours. Even at a maximum temperature from 1,900° C. to less than 2,000° C., the maximum temperature was necessary to be retained for not less than 2 hours. Further, when the retention time was made to be not less than 3 hours, or not less than 5 hours, a further decrease of volume resistivity was observed. When a maximum temperature of not less than 2,000° C. was retained for not less than 1 hour, a decrease of volume resistivity was observed. The retention time is preferred to be not more than 30 hours from the viewpoint of practical productivity in sintering furnaces. Cooling was conducted at a cooling rate of 300° C./hour from a maximum temperature to 1,400° C. Then, at 1,400° C., the power source was turned off, to allow spontaneous cooling. The influence of the cooling rate on resistance is not clear.

In the hot press process, there has now been proposed a process wherein boron nitride as a parting agent is applied between a shaped body or starting powder and a carbon jig. However, in the present invention, since there is a fear of inclusion of boron into the sintered bodies, use of the parting agent is not preferred.

BRIEF DESCRIPTION OF THE DRAWINGS

The above and other objects, features and advantages of the present invention will become more apparent from reading the following description of the preferred embodiments taken in connection with the accompanying drawings, wherein:

FIG. 10 is a graph showing a result of an analysis by EDS of a grain boundary of adjacent crystal grains with respect to the sintered body of an embodiment of the present invention;

FIG. 11 is a graph showing a result of an analysis by EDS of the inside of a crystal grain with respect to the sintered body shown in FIG. 10;

FIG. 24 is a spectrum obtained by cathode luminescence with respect to the sintered body of Comparative Example 52;

FIG. 25 shows spectra obtained by cathode luminescence, respectively of the sintered bodies of Example 54 and Comparative Example 52;

FIG. 26 is a photograph showing a cathode luminescence two-dimensional mapping of the sintered body of Example 54;

FIG. 27 is a photograph showing a relationship between shades in a cathode luminescence two-dimensional mapping and luminescence intensity;

FIG. 30a is a slant view showing a principal portion partially cut away of the electrostatic chuck shown in FIG. 29; and FIG. 30b is a slant view showing an example metal net usable as an electrode for an electrostatic chuck.

DESCRIPTION OF THE PREFERRED EMBODIMENTS

The present invention will be explained in more detail hereinafter by way of example and with reference to experimental results. The examples are not intended to limit the invention.

Figure 1:
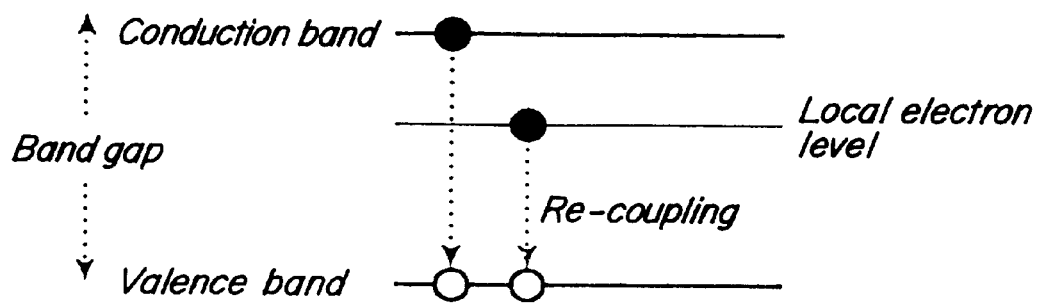
FIG. 1 is a schematic view illustrating a principle of cathode luminescence.
Figure 3:
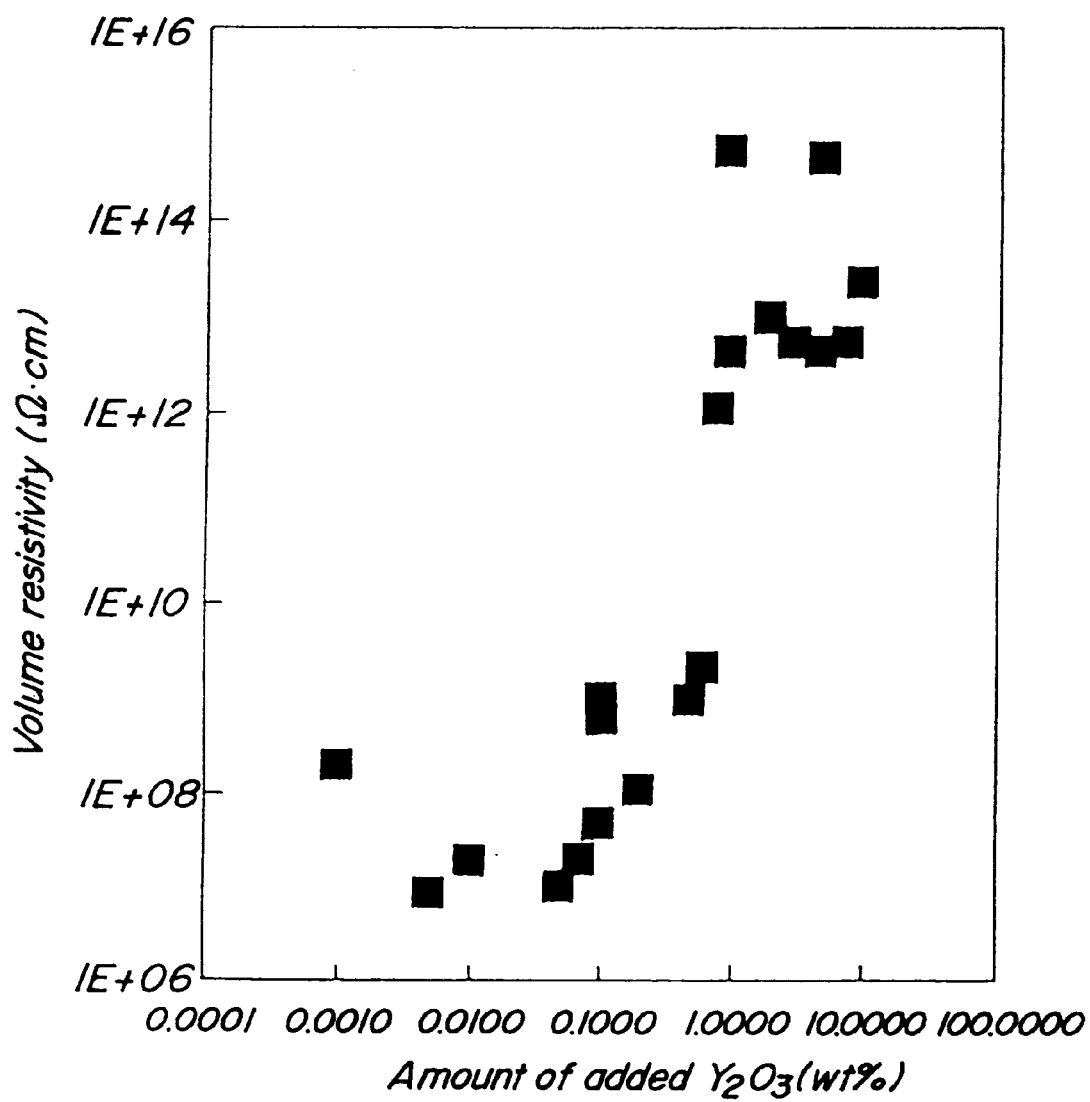
FIG. 3 is a graph showing a relationship between an amount of added $Y_2O_3$ and a volume resistivity of a sintered body.
Figure 5:
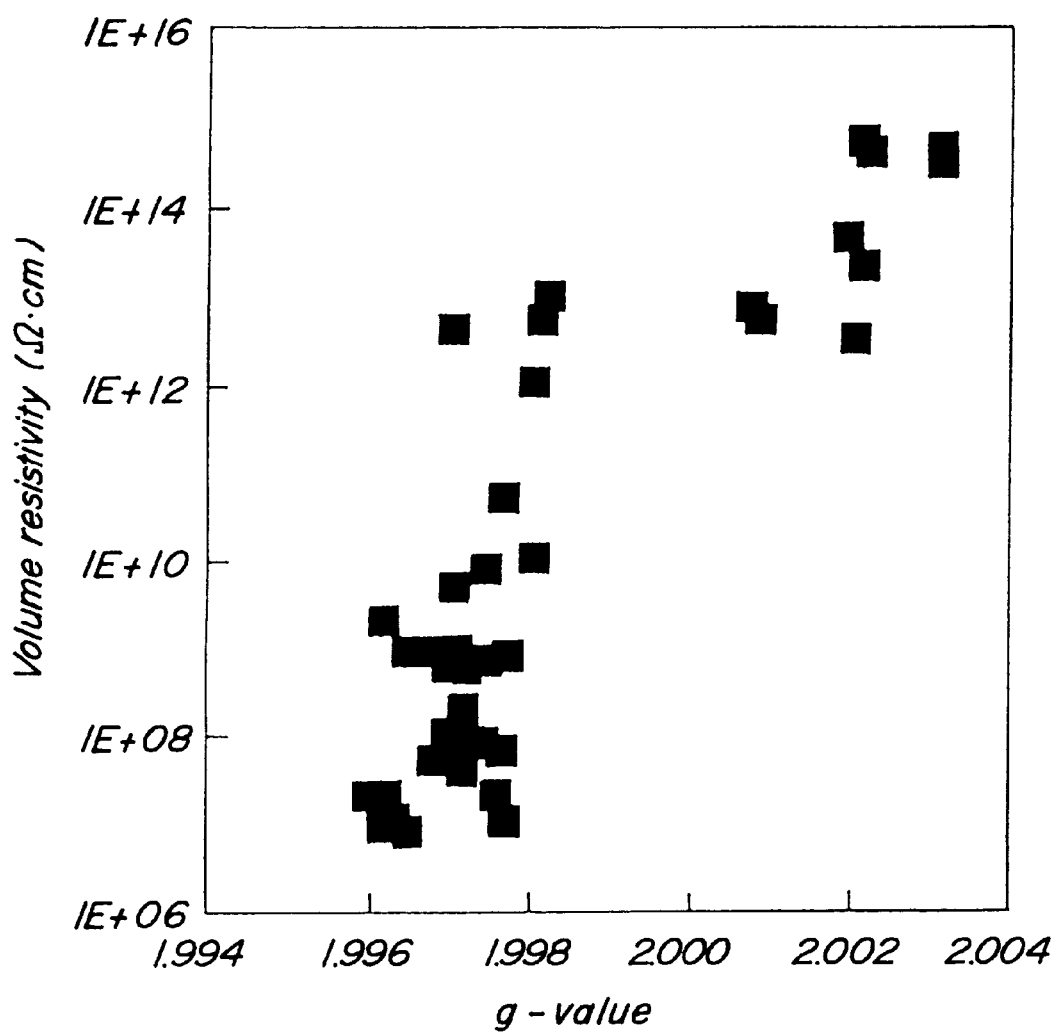
FIG. 5 is a graph showing a relationship between a g-value obtained from an ESR spectrum and a volume resistivity.

Each aluminum nitride sintered body shown in Tables 1–6 was produced. As the starting powder, aluminum nitride powder obtained by a reductive nitriding method was used. And amounts of oxygen and metal impurities in the starting powder are shown in FIGS. 1, 3 and 5. An additive solution was prepared by dissolving yttrium nitrate in isopropyl alcohol, and the additive solution was admixed with the aluminum nitride starting powder, using a pot mill. Mixing ratios of the yttrium as $Y_2O_3$ and amounts of the added alumina are shown in FIGS. 1, 3 and 5.

With this starting powder, disc-type shaped bodies having a diameter of 200 nm were produced by axial press molding at a pressure of 100 kgf /cm². The disc-type shaped body was received in a hot press mold and sealed hermetically. The temperature was increased at a temperature increasing rate of 300° C./hour. In this case, the pressure was reduced in the temperature range from room temperature to 1,000° C. Concurrently with the increase of this temperature up above this range, the pressure was raised. The maximum temperature was changed as shown in Tables 2, 4 and 6, and each maximum temperature was retained for the retention time shown in Tables 2, 4 and 6.

The total amount of the metal impurities except yttrium was determined with respect to each of the thus obtained sintered bodies and the results are shown in Tables 1, 3 and 5. Further, yttrium content (Y), total oxygen (O), total carbon (C), and excessive oxygen (a difference between a total oxygen content and an oxygen content in yttria) are shown in Tables 1, 3 and 5. Besides, each value mentioned below was determined with respect to each sintered body, and the results are shown in Tables 2, 4 and 6.

[g-Value]

Each g-value was found from a resonance condition formula in ESR. This formula is hv=g/μBH, wherein h is the Planck's constant, v is a frequency of microwave, μB is Bohr magneton, and H is a magnetic field.

[Spin Amount (spin/mg)]

Calculated as mentioned above.

[Average Grain Diameter]

An electron photomicrograph was taken and a mean value of the lengths of longitudinal axes was calculated with respect to the observed grains.

[Thermal Conductivity]

Determined by a laser flash method.

[Strength]

Determined by four-point bending test at room temperature according to JIS-1601.

[Relative Density]

Determined according to the Archimedes' method.

[Color]

The appearance was visually observed.

[Volume Resistivity]

Determined by a volume resistivity measuring method for insulators according to JIS-2141. Abbreviations are used in each Table and drawing. For example, "1E+06" is meant by "$1 \times 10^6$".

TABLE 1

| No. | | Volume resistivity (Ω · cm) | Oxygen content in starting powder (wt %) | Amount of metal impurity in starting powder (ppm) | Amount of $Y_2O_3$ added | Amount of $Al_2O_3$ added | Amount of metal impurity except Y (ppm) | Y (ppm) | O (wt %) | C (wt %) | Amount of excessive oxygen (wt %) |
|---|---|---|---|---|---|---|---|---|---|---|---|
| 1 | Comparative Example | 3E+14 | 1.8 | 5000 | 0.050 | 0 | 4500 | 350 | 1.70 | 0.05 | 1.69 |
| 2 | Comparative Example | 4E+13 | 1.5 | 3500 | 0.050 | 0 | 3100 | 320 | 1.40 | 0.05 | 1.39 |
| 3 | Comparative Example | 3E+12 | 1.2 | 3000 | 0.050 | 0 | 2800 | 350 | 1.10 | 0.05 | 1.09 |
| 4 | Comparative Example | 7E+12 | 1.0 | 1100 | 0.050 | 0 | 980 | 300 | 0.80 | 0.05 | 0.79 |
| 5 | Example | 7E+09 | 0.9 | 850 | 0.050 | 0 | 710 | 350 | 0.80 | 0.03 | 0.79 |
| 6 | Example | 9E+07 | 1.0 | 450 | 0.050 | 0 | 430 | 280 | 0.88 | 0.04 | 0.87 |
| 7 | Example | 8E+07 | 1.1 | 250 | 0.050 | 0 | 250 | 310 | 0.90 | 0.04 | 0.89 |
| 8 | Example | 9E+07 | 1.1 | 160 | 0.050 | 0 | 150 | 270 | 1.00 | 0.03 | 0.99 |
| 9 | Example | 6E+07 | 0.9 | 130 | 0.050 | 0 | 120 | 290 | 1.10 | 0.03 | 1.09 |
| 10 | Example | 2E+07 | 1.2 | 120 | 0.050 | 0 | 100 | 340 | 0.80 | 0.02 | 0.79 |
| 11 | Example | 1E+07 | 1.2 | 90 | 0.050 | 0 | 90 | 320 | 0.90 | 0.03 | 0.89 |
| 12 | Example | 8E+06 | 0.8 | 70 | 0.050 | 0 | 60 | 360 | 0.60 | 0.04 | 0.59 |
| 13 | Example | 8E+06 | 0.9 | 30 | 0.050 | 0 | 30 | 340 | 0.80 | 0.02 | 0.79 |
| 14 | Example | 1E+07 | 1.2 | 90 | 0.050 | 0 | 90 | 320 | 0.90 | 0.03 | 0.89 |

TABLE 2

| No. | | Maximum temperature (° C.) | Retention time (Hr) | g-value | Spin number (×$10^3$ spin/mg) | Average grain diameter (μm) | Thermal conductivity (W/mK) | Strength (MPa) | Relative density (%) | Color |
|---|---|---|---|---|---|---|---|---|---|---|
| 1 | Comparative Example | 2000 | 5 | 2.0032 | 0.4 | 12 | 70 | 320 | 98.9 | black |
| 2 | Comparative Example | 1950 | 5 | 2.0020 | 0.3 | 9 | 60 | 290 | 99.6 | gray |
| 3 | Comparative Example | 2000 | 5 | 2.0021 | 0.3 | 13 | 60 | 310 | 99.3 | amber |
| 4 | Comparative Example | 2000 | 5 | 2.0008 | 1.0 | 13 | 70 | 290 | 99.5 | amber |
| 5 | Example | 2000 | 5 | 1.9975 | 1.8 | 10 | 80 | 330 | 99.6 | amber |
| 6 | Example | 2000 | 5 | 1.9972 | 1.9 | 11 | 80 | 340 | 99.6 | amber |
| 7 | Example | 2000 | 5 | 1.9974 | 2.1 | 9 | 80 | 330 | 98.8 | amber |
| 8 | Example | 2000 | 5 | 1.9972 | 2.8 | 8 | 90 | 290 | 99.9 | amber |
| 9 | Example | 2000 | 5 | 1.9977 | 2.9 | 9 | 100 | 340 | 99.8 | amber |
| 10 | Example | 2000 | 5 | 1.9976 | 2.8 | 12 | 70 | 390 | 99.7 | amber |
| 11 | Example | 2000 | 5 | 1.9977 | 2.9 | 11 | 60 | 320 | 99.9 | amber |
| 12 | Example | 2000 | 5 | 1.9965 | 3.5 | 10 | 80 | 310 | 99.9 | amber |
| 13 | Example | 2000 | 5 | 1.9964 | 4.2 | 9 | 60 | 330 | 99.8 | amber |
| 14 | Example | 2200 | 1 | 1.9996 | 2.9 | 12 | 70 | 310 | 99.9 | amber |

TABLE 3

| No. | | Volume resistivity (Ω · cm) | Oxygen content in starting powder (wt %) | Amount of metal impurity in starting powder (ppm) | Amount of $Y_2O_3$ added | Amount of $Al_2O_3$ added | Amount of metal impurity except Y (ppm) | Y (ppm) | O (wt %) | C (wt %) | Amount of excessive oxygen (wt %) |
|---|---|---|---|---|---|---|---|---|---|---|---|
| 15 | Comparative Example | 2E+13 | 1.2 | 90 | 10 | 0 | 90 | 900 | 0.10 | 0.03 | 0.08 |
| 16 | Comparative Example | 5E+12 | 1.2 | 90 | 8 | 0 | 80 | 870 | 0.10 | 0.02 | 0.08 |
| 17 | Comparative Example | 4E+12 | 1.2 | 90 | 5 | 0 | 70 | 780 | 0.20 | 0.03 | 0.18 |
| 18 | Comparative Example | 4E+14 | 1.2 | 90 | 5 | 0 | 90 | 32500 | 1.98 | 0.02 | 1.11 |
| 19 | Comparative Example | 5E+12 | 1.2 | 90 | 3 | 0 | 90 | 790 | 0.20 | 0.02 | 0.18 |
| 20 | Comparative Example | 9E+12 | 1.2 | 90 | 2 | 0 | 80 | 540 | 0.30 | 0.03 | 0.29 |
| 21 | Comparative Example | 5E+14 | 1.2 | 90 | 1 | 0 | 90 | 6000 | 1.30 | 0.04 | 1.14 |
| 22 | Comparative Example | 4E+12 | 1.2 | 90 | 1 | 0 | 70 | 660 | 0.20 | 0.02 | 0.18 |
| 23 | Example | 1E+12 | 1.2 | 90 | 0.8 | 0 | 90 | 670 | 0.50 | 0.03 | 0.48 |
| 24 | Example | 2E+09 | 1.2 | 90 | 0.6 | 0 | 90 | 560 | 0.85 | 0.01 | 0.83 |
| 25 | Example | 9E+08 | 1.2 | 90 | 0.5 | 0 | 80 | 450 | 0.90 | 0.03 | 0.89 |
| 26 | Example | 1E+08 | 1.2 | 90 | 0.2 | 0 | 80 | 560 | 0.85 | 0.02 | 0.83 |
| 27 | Example | 5E+07 | 1.2 | 90 | 0.1 | 0 | 80 | 640 | 0.92 | 0.03 | 0.90 |
| 28 | Example | 2E+07 | 1.2 | 90 | 0.07 | 0 | 90 | 450 | 0.95 | 0.03 | 0.94 |
| 29 | Example | 1E+07 | 1.2 | 90 | 0.05 | 0 | 70 | 320 | 0.84 | 0.02 | 0.83 |

TABLE 4

| No. | | Maximum temperature (° C.) | Retention time (Hr) | g-value | Spin number (×$10^3$ spin/mg) | Average grain diameter (μm) | Thermal conductivity (W/mK) | Strength (MPa) | Relative density (%) | Color |
|---|---|---|---|---|---|---|---|---|---|---|
| 15 | Comparative Example | 2000 | 5 | 2.0022 | 0.4 | 12 | 130 | 290 | 99.9 | gray |
| 16 | Comparative Example | 2000 | 5 | 2.0009 | 1.0 | 10 | 140 | 280 | 99.8 | amber |
| 17 | Comparative Example | 2000 | 5 | 1.9971 | 0.8 | 11 | 190 | 310 | 99.6 | amber |
| 18 | Comparative Example | 1850 | 2 | 2.0032 | 0.3 | 3 | 150 | 320 | 99.9 | gray |
| 19 | Comparative Example | 2000 | 5 | 1.9982 | 0.5 | 12 | 130 | 330 | 99.9 | amber |
| 20 | Comparative Example | 2000 | 5 | 1.9983 | 0.7 | 9 | 110 | 380 | 99.8 | amber |
| 21 | Comparative Example | 1850 | 2 | 2.0022 | 0.3 | 2 | 120 | 380 | 99.7 | gray |
| 22 | Comparative Example | 2000 | 5 | 1.9971 | 0.8 | 8 | 100 | 270 | 99.7 | amber |
| 23 | Example | 2000 | 5 | 1.9981 | 1.1 | 10 | 90 | 310 | 99.9 | amber |
| 24 | Example | 2000 | 5 | 1.9962 | 2.0 | 12 | 90 | 300 | 99.6 | amber |
| 25 | Example | 2000 | 5 | 1.9965 | 1.9 | 10 | 120 | 350 | 99.9 | amber |
| 26 | Example | 2000 | 5 | 1.9970 | 2.2 | 8 | 90 | 320 | 99.8 | amber |
| 27 | Example | 2000 | 5 | 1.9968 | 2.9 | 9 | 80 | 300 | 99.7 | amber |
| 28 | Example | 2000 | 5 | 1.9962 | 4.3 | 11 | 110 | 290 | 99.9 | amber |
| 29 | Example | 2000 | 5 | 1.9963 | 3.5 | 11 | 90 | 350 | 99.9 | amber |

TABLE 5

| No. | | Volume resistivity (Ω · cm) | Oxygen content in starting powder (wt %) | Amount of metal impurity in starting powder (ppm) | Amount of $Y_2O_3$ added | Amount of $Al_2O_3$ added | Amount of metal impurity except Y (ppm) | Y (ppm) | O (wt %) | C (wt %) | Amount of excessive oxygen (wt %) |
|---|---|---|---|---|---|---|---|---|---|---|---|
| 36 | Example | 6E+08 | 1.2 | 90 | 0.10 | 2 | 80 | 500 | 1.73 | 0.02 | 1.72 |
| 37 | Example | 9E+08 | 1.2 | 90 | 0.10 | 2 | 80 | 450 | 1.73 | 0.02 | 1.72 |
| 38 | Example | 9E+08 | 1.2 | 90 | 0.10 | 1 | 90 | 600 | 1.30 | 0.02 | 1.28 |
| 39 | Example | 7E+08 | 1.2 | 90 | 0.10 | 0.5 | 80 | 600 | 1.00 | 0.03 | 0.98 |
| 40 | Example | 4E+07 | 1.2 | 90 | 0.10 | 0 | 90 | 460 | 0.77 | 0.02 | 0.76 |
| 41 | Example | 6E+08 | 1.2 | 90 | 0.10 | 0 | 90 | 450 | 0.75 | 0.02 | 0.74 |

TABLE 5-continued

| No. | | Volume resistivity (Ω · cm) | Oxygen content in starting powder (wt %) | Amount of metal impurity in starting powder (ppm) | Amount of $Y_2O_3$ added | Amount of $Al_2O_3$ added | Amount of metal impurity except Y (ppm) | Y (ppm) | O (wt %) | C (wt %) | Amount of excessive oxygen (wt %) |
|---|---|---|---|---|---|---|---|---|---|---|---|
| 42 | Example | 7E+08 | 1.2 | 90 | 0.10 | 0 | 90 | 520 | 0.86 | 0.03 | 0.84 |
| 43 | Example | 8E+08 | 1.2 | 90 | 0.10 | 0 | 80 | 400 | 0.80 | 0.01 | 0.79 |
| 44 | Example | 5E+09 | 1.2 | 90 | 0.10 | 0 | 90 | 350 | 0.80 | 0.05 | 0.79 |
| 46 | Comparative Example | 4E+14 | 1.2 | 90 | 0.10 | 0 | 90 | 70 | 0.95 | 0.01 | 0.95 |

TABLE 6

| No. | | Maximum temperature (° C.) | Retention time (Hr) | g-value | Spin number (×10³ spin/mg) | Average grain diameter (μm) | Thermal conductivity (W/mK) | Strength (MPa) | Relative density (%) | Color |
|---|---|---|---|---|---|---|---|---|---|---|
| 36 | Example | 2000 | 5 | 1.9970 | 1.9 | 11 | 80 | 280 | 99.6 | amber |
| 37 | Example | 1900 | 5 | 1.9971 | 1.9 | 10 | 70 | 320 | 99.7 | amber |
| 38 | Example | 2000 | 5 | 1.9969 | 2.2 | 9 | 80 | 310 | 99.8 | amber |
| 39 | Example | 2000 | 5 | 1.9975 | 2.2 | 8 | 90 | 250 | 99.8 | amber |
| 40 | Example | 1950 | 5 | 1.9972 | 2.7 | 9 | 90 | 330 | 99.8 | amber |
| 41 | Example | 1900 | 5 | 1.9972 | 2.7 | 8 | 90 | 330 | 99.8 | amber |
| 42 | Example | 1850 | 5 | 1.9975 | 2.4 | 7 | 100 | 310 | 99.9 | amber |
| 43 | Example | 1800 | 5 | 1.9978 | 2.1 | 5 | 100 | 350 | 99.9 | amber |
| 44 | Example | 1780 | 5 | 1.9971 | 1.9 | 3 | 90 | 290 | 99.5 | amber |
| 46 | Comparative Example | 1700 | 5 | 2.0023 | 0.5 | 2 | 80 | 260 | 98.5 | gray |

Figure 2:
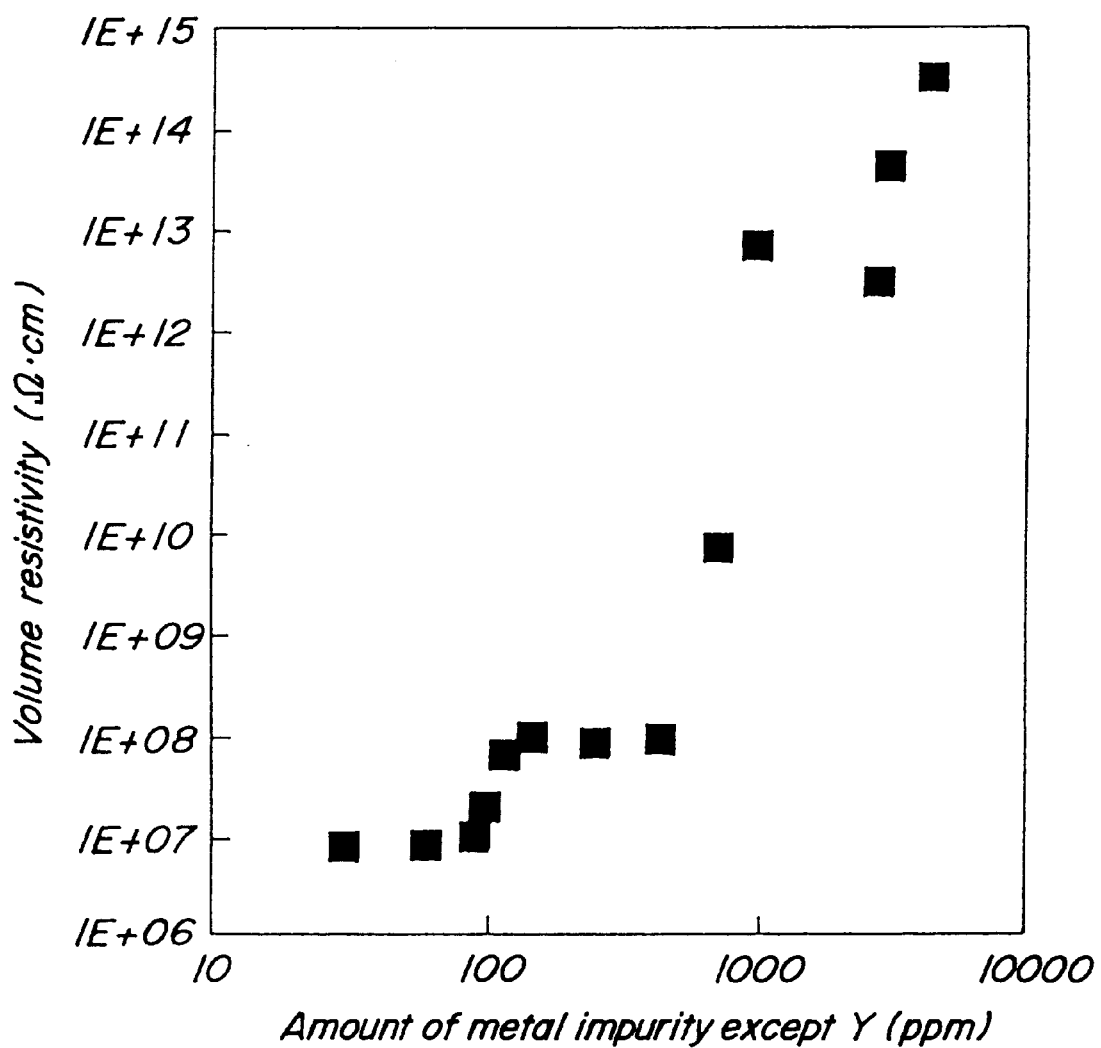
FIG. 2 is a graph showing a relationship between an amount of metal impurities except yttrium and volume resistivity.

In Tables 1 and 2, the amount of the metal impurities except yttrium in the sintered body was variously changed. A relationship between an amount of metal impurities except yttrium and a volume resistivity is shown in FIG. 2. As is seen from the result, when the amount of metal impurities is not more than 500 ppm, the volume resistivity is extremely decreased.

In Tables 3 and 4, the amount of the added $Y_2O_3$ was variously changed. A relationship between an amount of added $Y_2O_3$ and a volume resistivity of the sintered body is shown in FIG. 3. When the amount of the added $Y_2O_3$ is not more than 0.5% by weight, the volume resistivity is extremely decreased, and it is further noticeably decreased when the yttria is not more than 0.1% by weight. In a region below this value, no noticeable particular change was observed.

Figure 4:
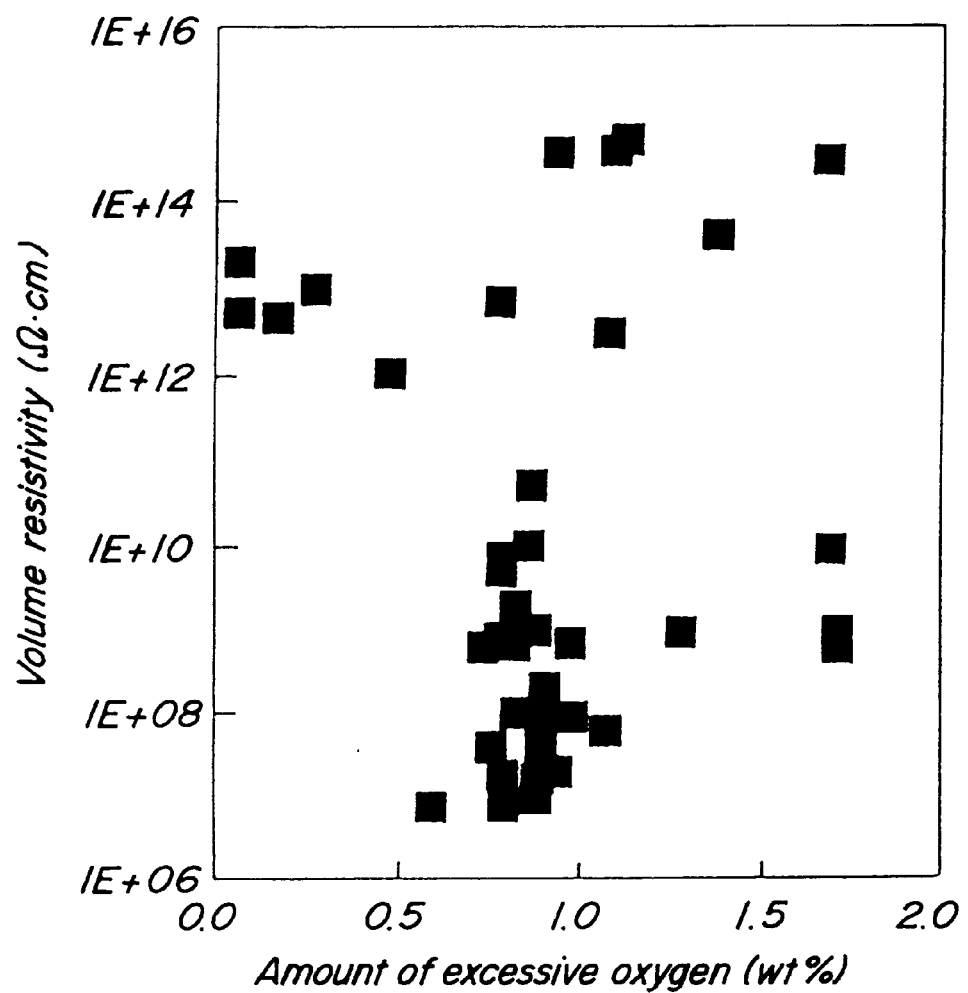
FIG. 4 is a graph showing a relationship between an amount of excessive oxygen and a volume resistivity.

FIG. 4 is a graph showing a relationship between an excessive oxygen and a volume resistivity. As is seen from this graph, if the excessive oxygen, i.e., an amount of oxygen existing in aluminum nitride crystal grains, becomes less than 0.5% by weight, the volume resistivity is extremely increased. When the excessive oxygen is within the range from 0.5% to 2.0%, by weight, a sintered body having a high volume resistivity (not less than $1 \times 10^{12}$ Ω·cm) and that having a volume resistivity of not more than $1 \times 10^{10}$ Ω·cm will co-exist. Its reason is assumable to be that even if oxygen forms solid-solution in aluminum nitride grains, the resistance is not decreased when the grain diameter is small.

FIG. 5 is a graph showing a relationship between a g-value obtained from an ESR spectrum and a volume resistivity. As is seen from this graph, when the g-value exceeds 2.000, the volume resistivity is extremely increased. On the other hand, when the g-value is not more than 2.000, a sintered body having a high volume resistivity (not less than $1 \times 10^{12}$ Ω·cm) and that having a volume resistivity of not more than $1 \times 10^{10}$ Ω·cm co-exist.

Figure 6:
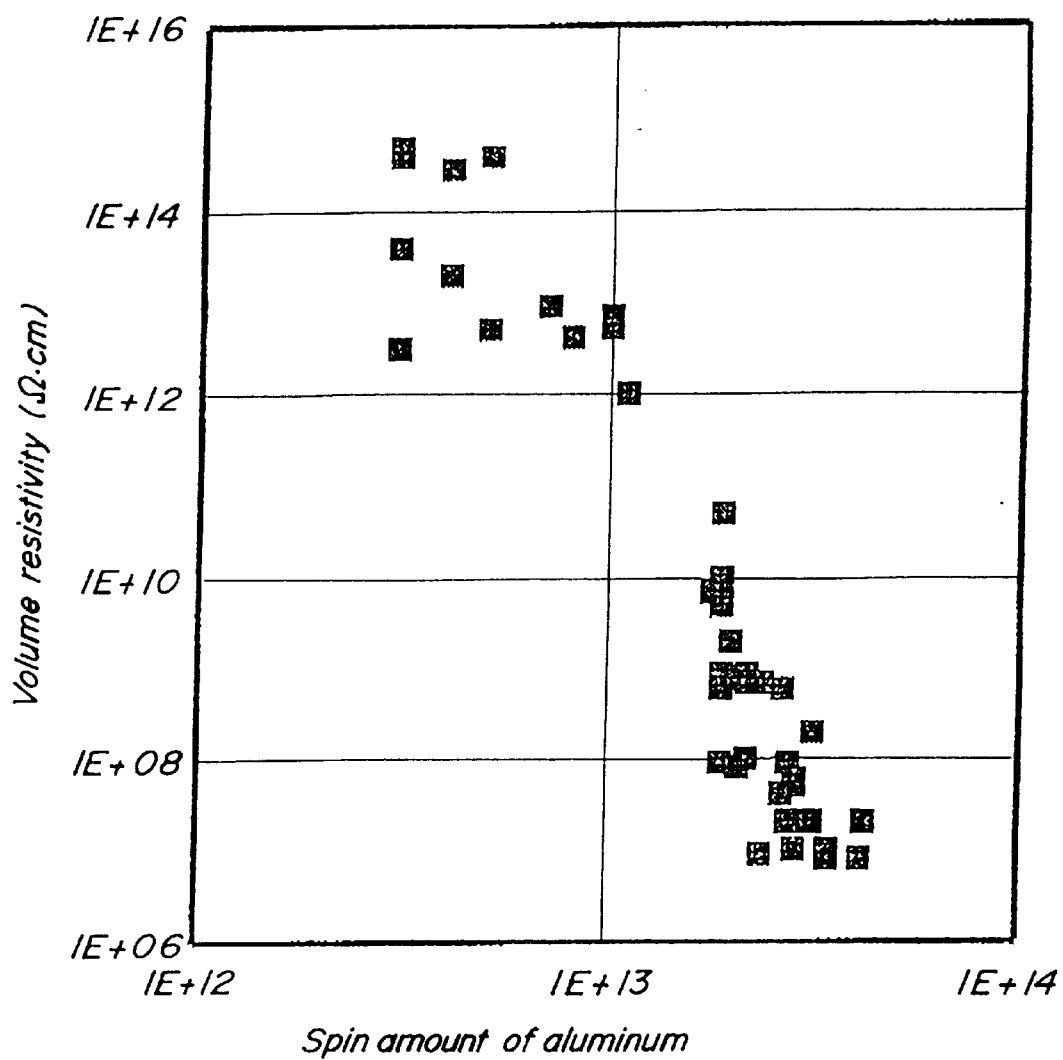
FIG. 6 is a graph showing a spin amount based on an ESR spectrum and a volume resistivity.

FIG. 6 is a graph showing a relationship between a spin amount per unit mg of aluminum obtained from an ESR spectrum and a volume resistivity. As is seen from this result, when the spin amount was not less than $1 \times 10^{13}$ spins/mg, the volume resistivity was extremely decreased.

In Tables 3 and 4, the amounts of oxygen and metal impurities in the starting material were optimized, and the amount of yttrium was changed. As is seen from the result, in order to further decrease the volume resistivity, the content of the yttrium in a sintered body is preferred to be not more than 1000 ppm, more preferably not less than 300 ppm.

In Tables 5 and 6, the amounts of the oxygen and metal impurities in the starting material were optimized, and the maximum temperature was changed. When the maximum temperature was low, grain growth was not enough and, therefore, the volume resistivity did not reach a level of $1 \times 10^{10}$ Ω·cm.

Figure 7:
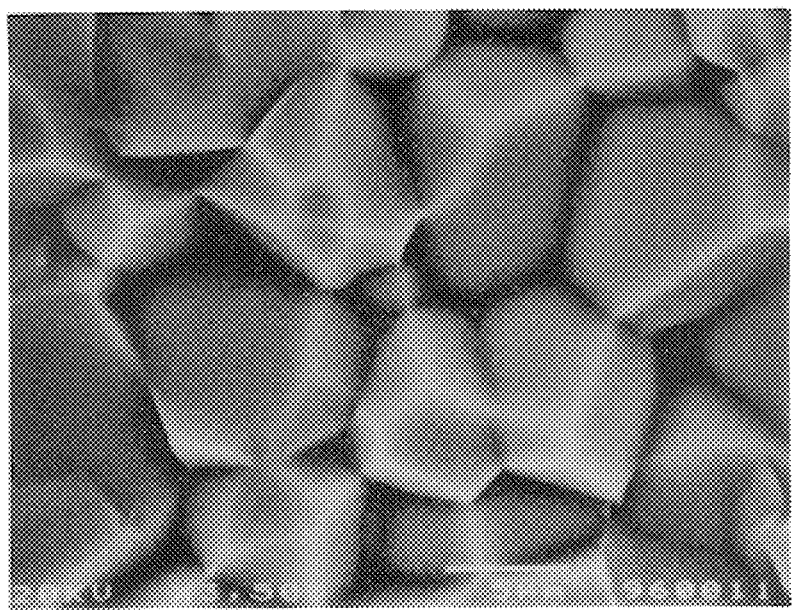
FIG. 7 is a scanning electron photomicrograph showing a ceramic tissue with respect to the sintered body of the Example 11.
Figure 8:
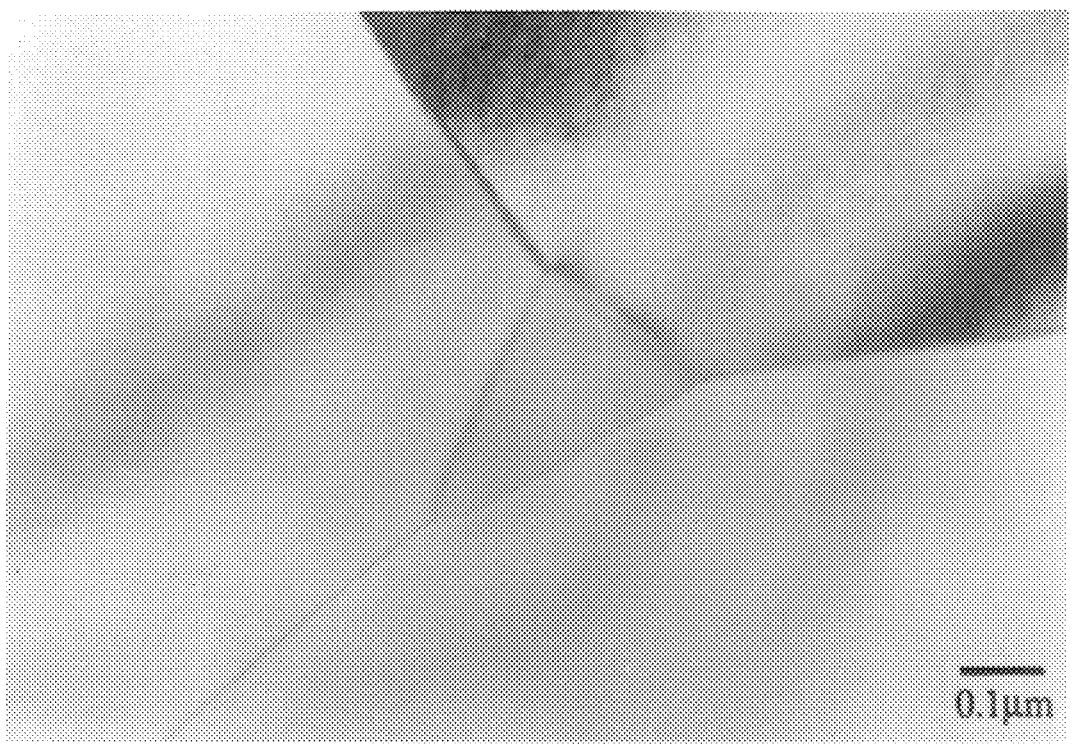
FIG. 8 is a transition electron photomicrograph showing an enlargement of a ceramic tissue around a triple point of the sintered body shown in FIG. 7.
Figure 9:
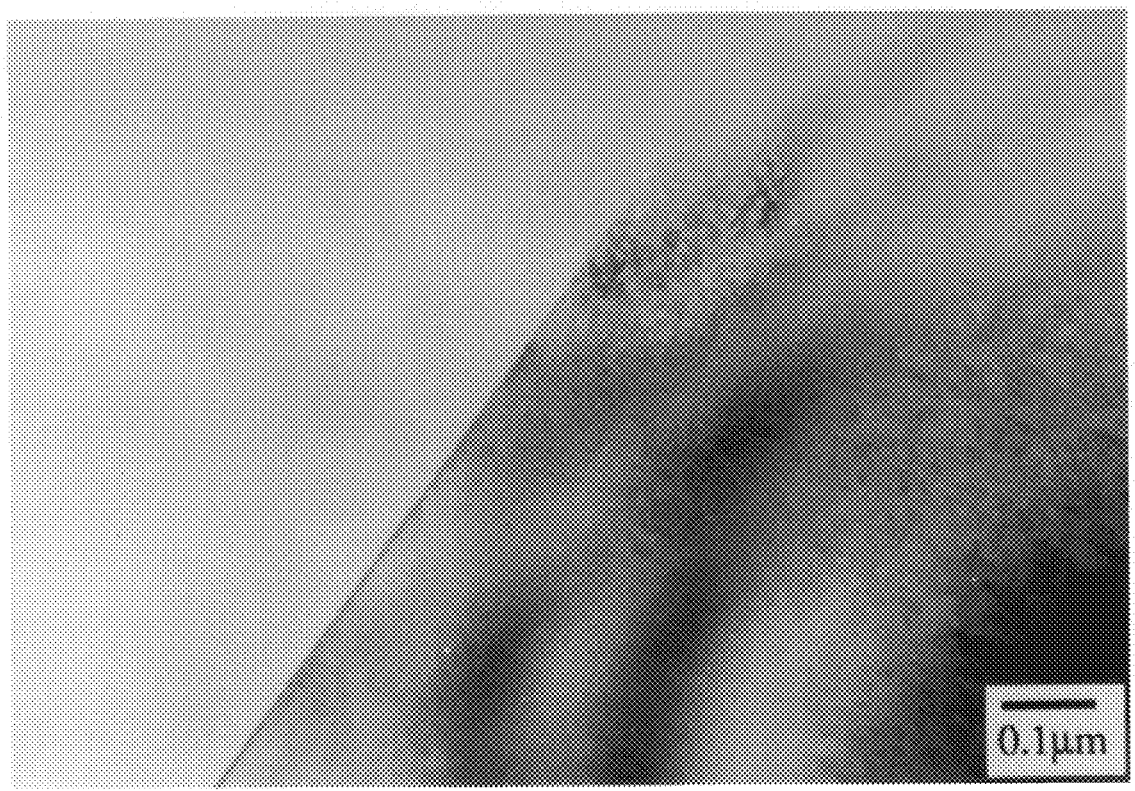
FIG. 9 is a transition electron photomicrograph showing an enlargement of a grain boundary of adjacent crystal grains with respect to the sintered body of an embodiment of the present invention.

FIG. 7 is a scanning electron photomicrograph showing a crystal structure of the sintered body No. 11. FIG. 8 is a transition electron photomicrograph showing an enlargement of the vicinity of a triple point of this sintered body. FIG. 9 is a transition electron photomicrograph showing an enlargement of a grain boundary of adjacent crystal grains. Though no intergranular phase is observed in the boundaries of adjacent crystal grains, an aluminum oxide phase has been formed at the triple point.

FIG. 10 is a graph showing a result of an analysis by EDS (Energy Dispersive X-ray Spectrometer) of a grain boundary of adjacent crystal grains with respect to the sintered body No. 11 of an embodiment of the present invention, and it shows that the yttrium exists in a trace amount. However, the peak of "C" is attributed to the contamination of the sample. FIG. 11 is a graph showing a result of an analysis by EDS of the inside of a crystal grain with respect to the same sample. No peak of yttrium is observed and it shows existence of a peak of oxygen.

Figure 12:
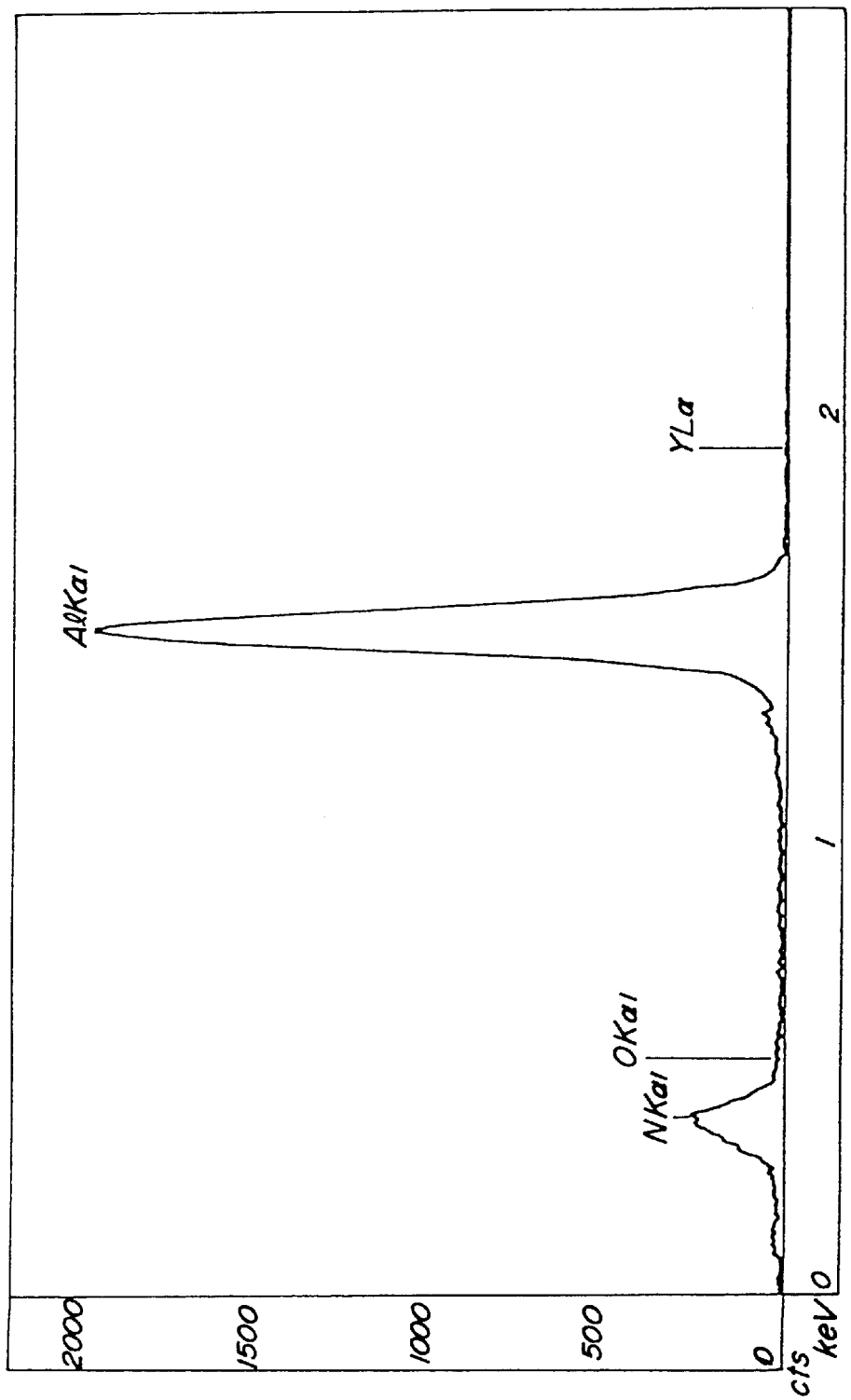
FIG. 12 is a graph showing a result of an analysis by EDS of the inside of a crystal grain with respect to a sintered body of a comparative example.
Figure 13:
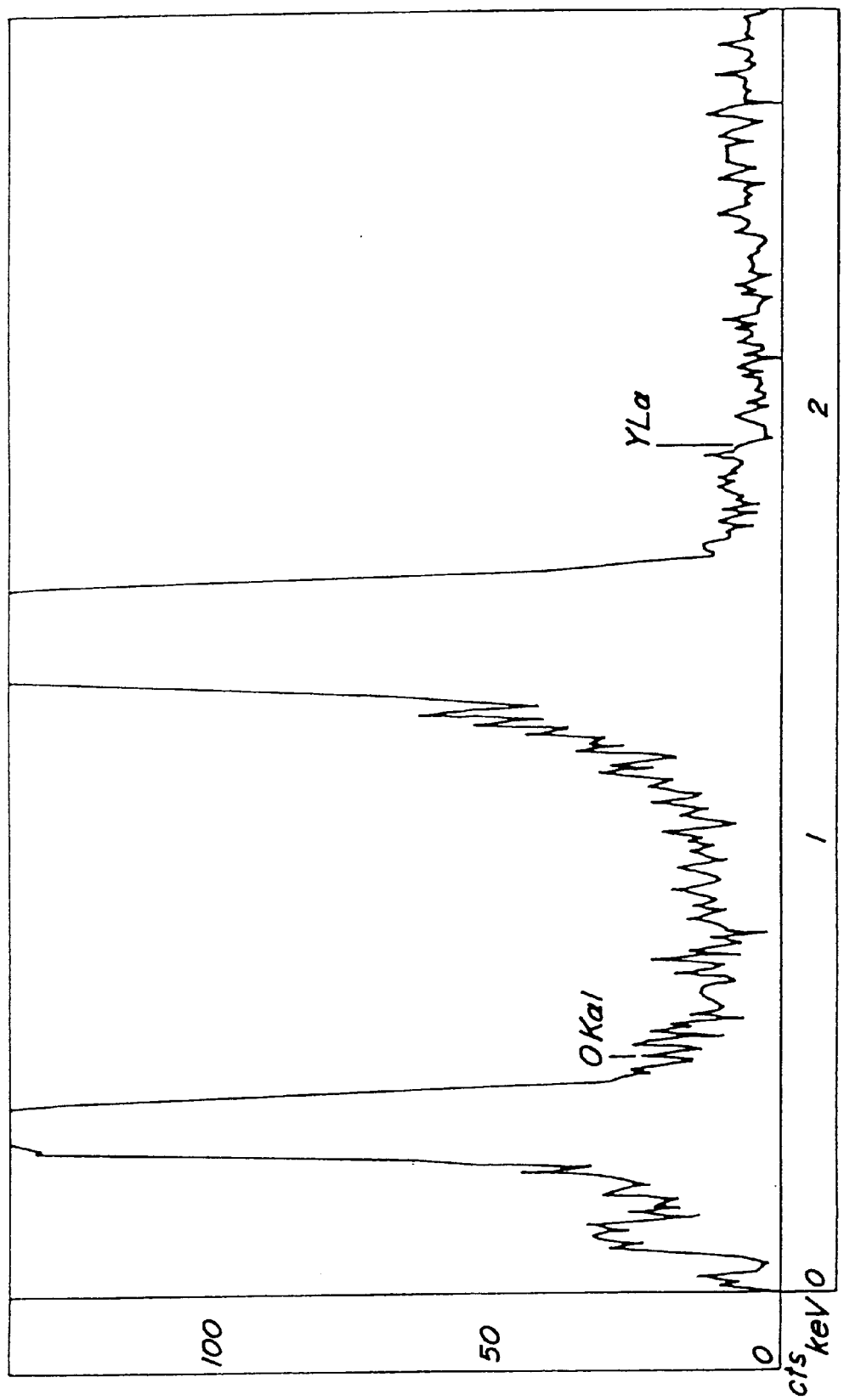
FIG. 13 is a graph showing a result of an analysis of EDS of the inside of a crystal grain with respect to a sintered body of a comparative example.
Figure 14:
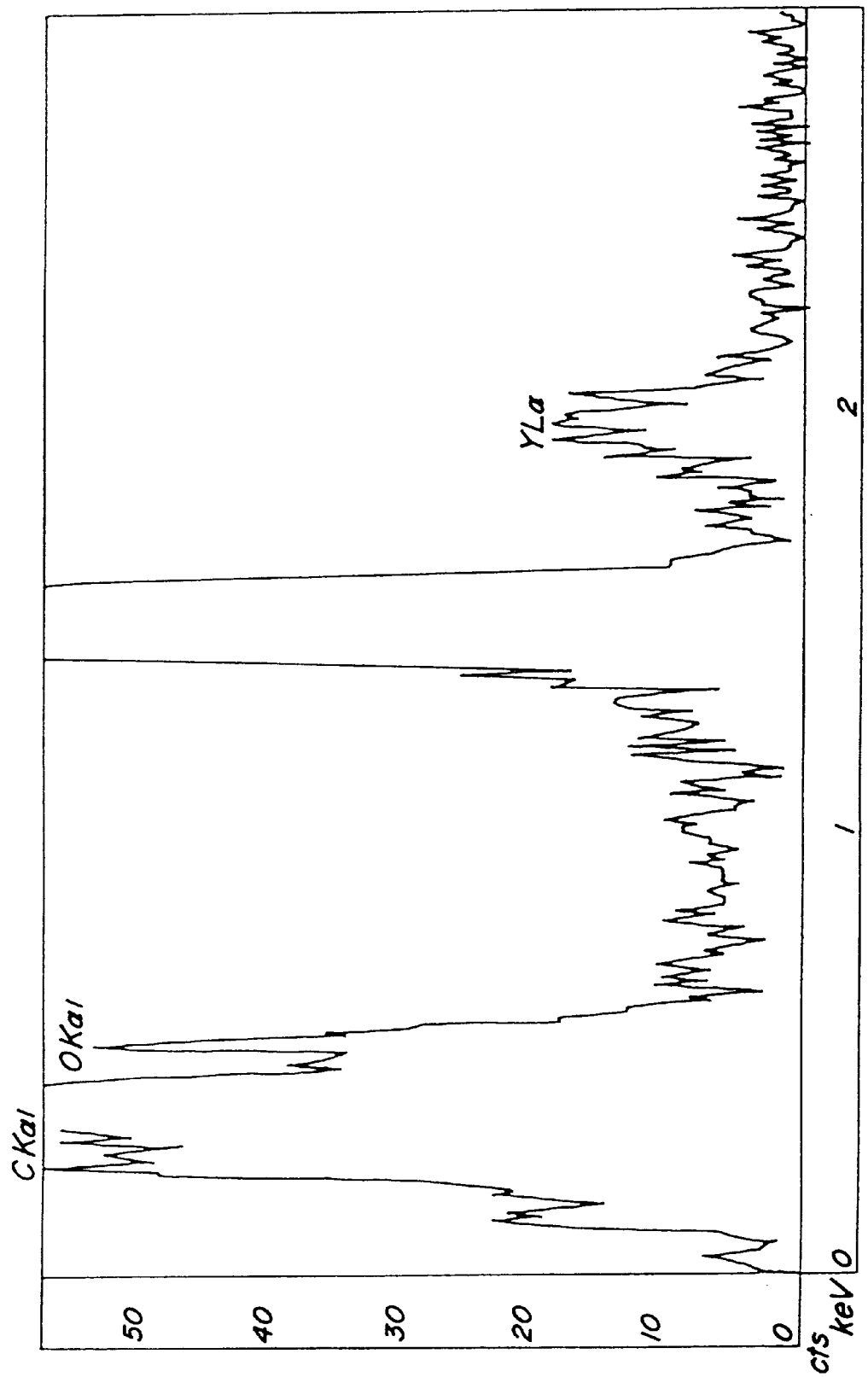
FIG. 14 is a graph showing a result of an analysis by EDS of a grain boundary of adjacent crystal grains with respect to the sintered body shown in FIG. 12.

FIGS. 12 and 13 are graphs respectively showing results of analyses by EDS of the inside of a crystal grain with respect to the sintered body No. 16 in a comparative example. No peaks of oxygen and yttrium are observed.
FIG. 14 is a graph showing a result of an analysis by EDS of a grain boundary in the interface of crystal grains with respect to the same sintered body as the above. A conspicuous peak of yttrium is observed. This intergranular phase containing a large amount of yttrium contributes to increase the resistance between adjacent crystal grains.

Figure 15:
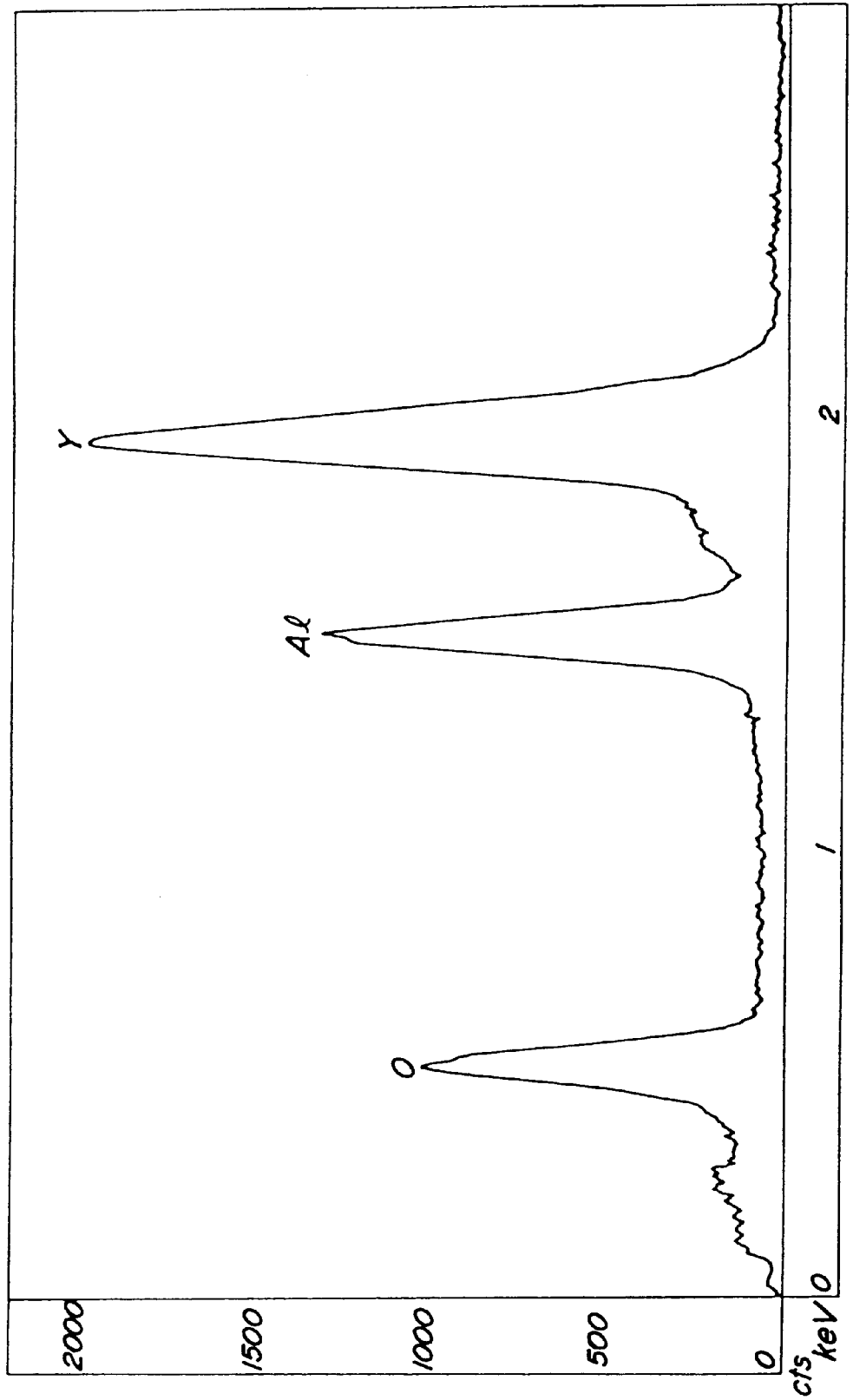
FIG. 15 is a graph showing a result of an analysis by EDS of a triple point with respect to a sintered body of a comparative example.

FIG. 15 is a graph showing a result of an analysis by EDS of a triple point with respect to the sintered body No. 16 in a comparative example. A further conspicuous peak of yttrium is observed.

Figure 16:
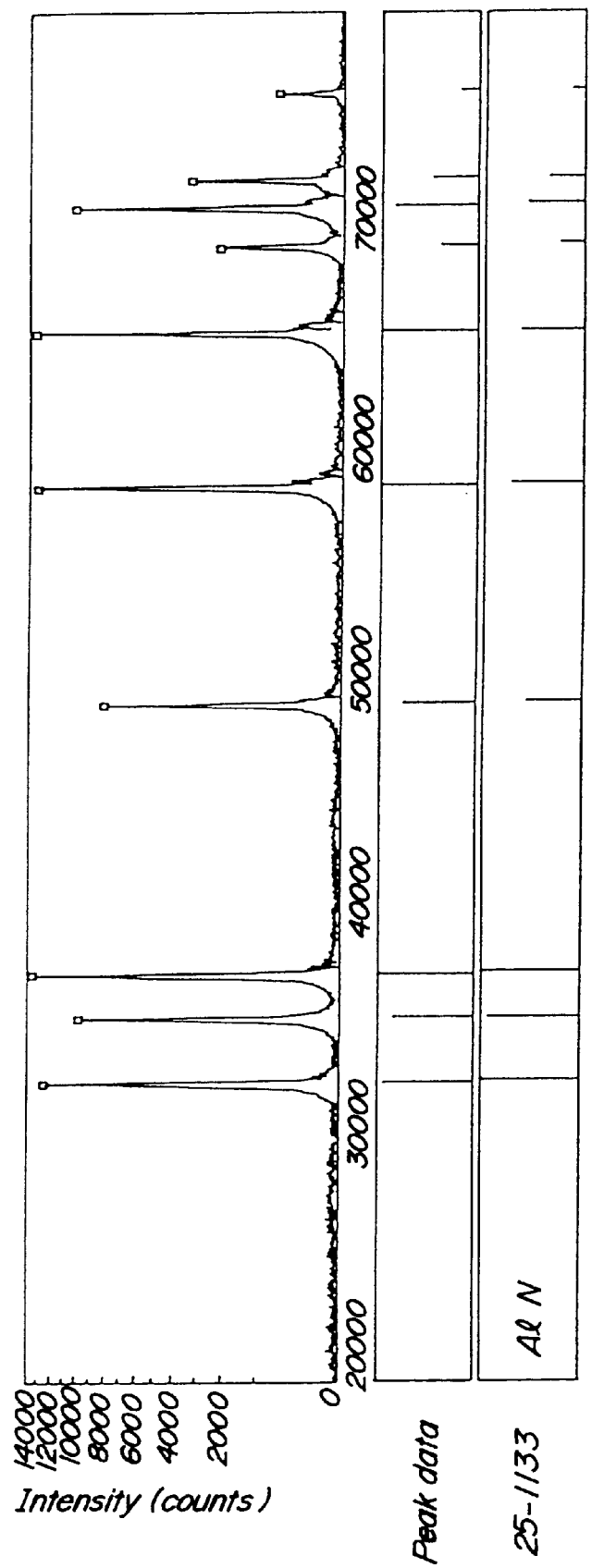
FIG. 16 is a graph showing an X-ray diffraction peak with respect to the sintered body of an embodiment of the present invention.

FIG. 16 is a graph showing an X-ray diffraction peak with respect to the sintered body No. 11 in an embodiment of the present invention. As is seen from this graph, there is no peak corresponding to crystals of an yttrium compound. Therefore, yttrium does not constitute a crystalline phase at the boundary of crystal grains.

Figure 17:
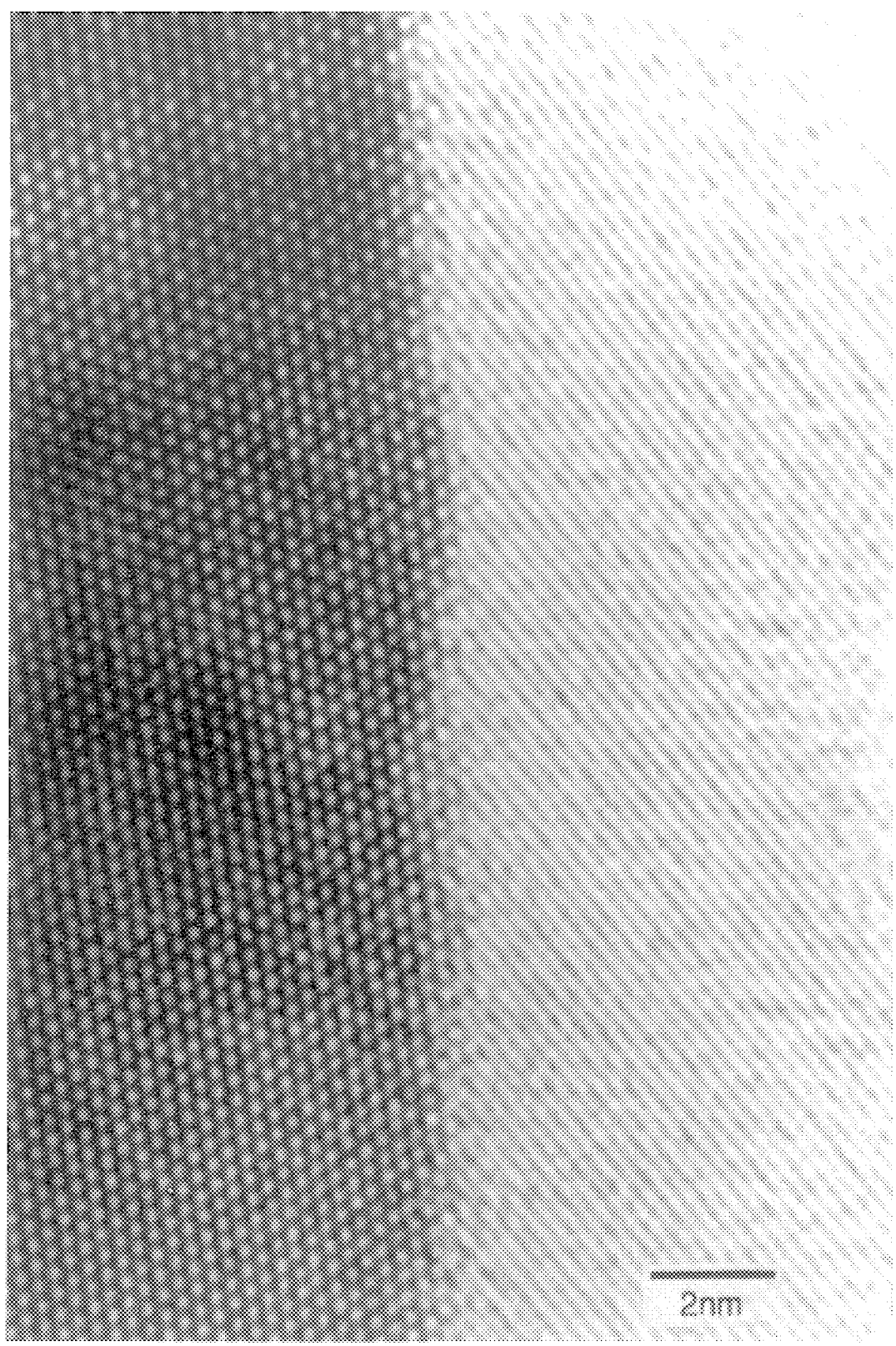
FIG. 17 is a TEM photograph of a ceramic tissue in a high magnification showing a crystal tissue in the vicinity of a grain boundary of adjacent crystal grains with respect to the sintered body of an embodiment of the present invention.

FIG. 17 is a TEM photograph in a high magnification showing a crystal tissue near the grain boundary of adjacent crystal grains with respect to the sintered body No. 11 of an embodiment of the present invention. The crystal grains are present on the right and left hand sides, respectively, in this photograph, and an interface exists between crystal grains in the right and left directions. Inside of each crystal grain, constituent atoms of a crystal lattice form a perfect orderly crystal lattice. It has been found that though the crystal lattice is slightly disordered in the vicinity of the grain boundary of the crystal grains, the width of the portion where the crystal lattice is disordered is extremely as narrow as about several numbers of atoms, that is, no more than 1 nm.

Figure 18:
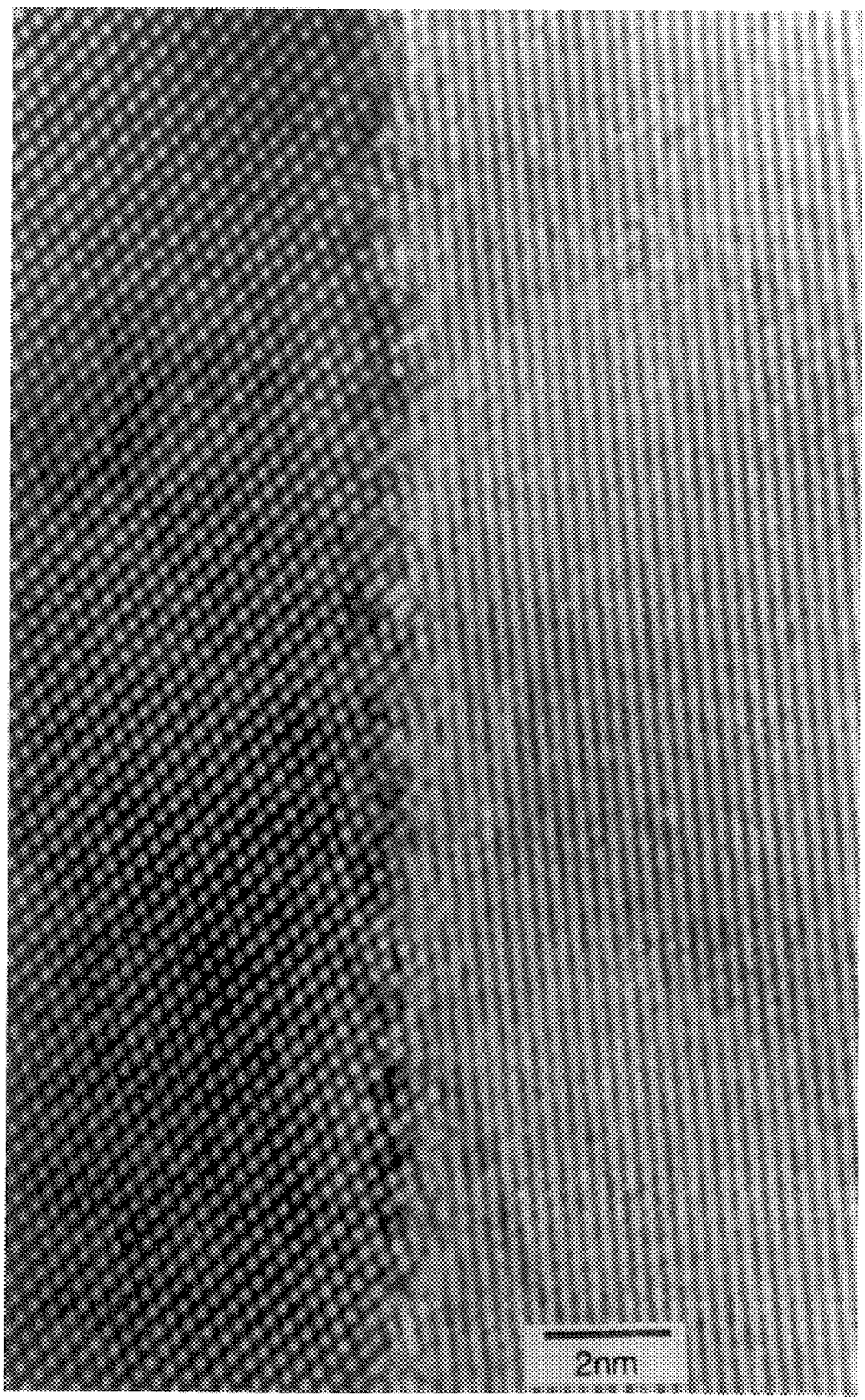
FIG. 18 is a TEM photograph of a ceramic tissue in a high magnification showing a crystal tissue in the vicinity of a grain boundary of adjacent crystal grains with respect to a sintered body of a comparative example.

FIG. 18 is a TEM photograph in a high magnification showing a crystal tissue near the grain boundary of adjacent crystal grains with respect to the sintered body No. 16 of a comparative example. A disorder of crystal lattice is recognized in the vicinity of the grain boundary between the right and left grains. Its width is about 1–3 nm. From the result of a restricted view field electron diffraction, crystalline precipitates were detected at the grain boundary. This disordering of the crystal lattice is assumed to be caused by fine precipitates deposited in grain boundaries.

Figure 19:
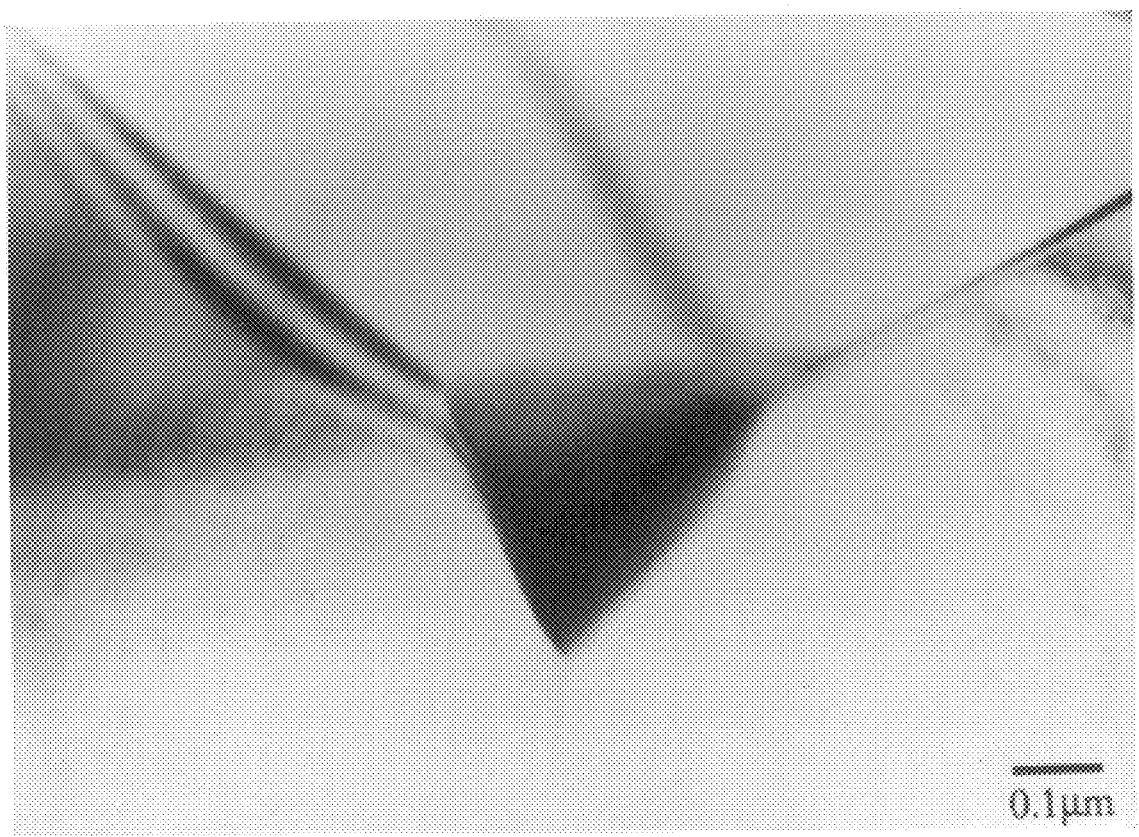
FIG. 19 is a transition electron photomicrograph showing a ceramic tissue of a sintered body of a comparative example.
Figure 20:
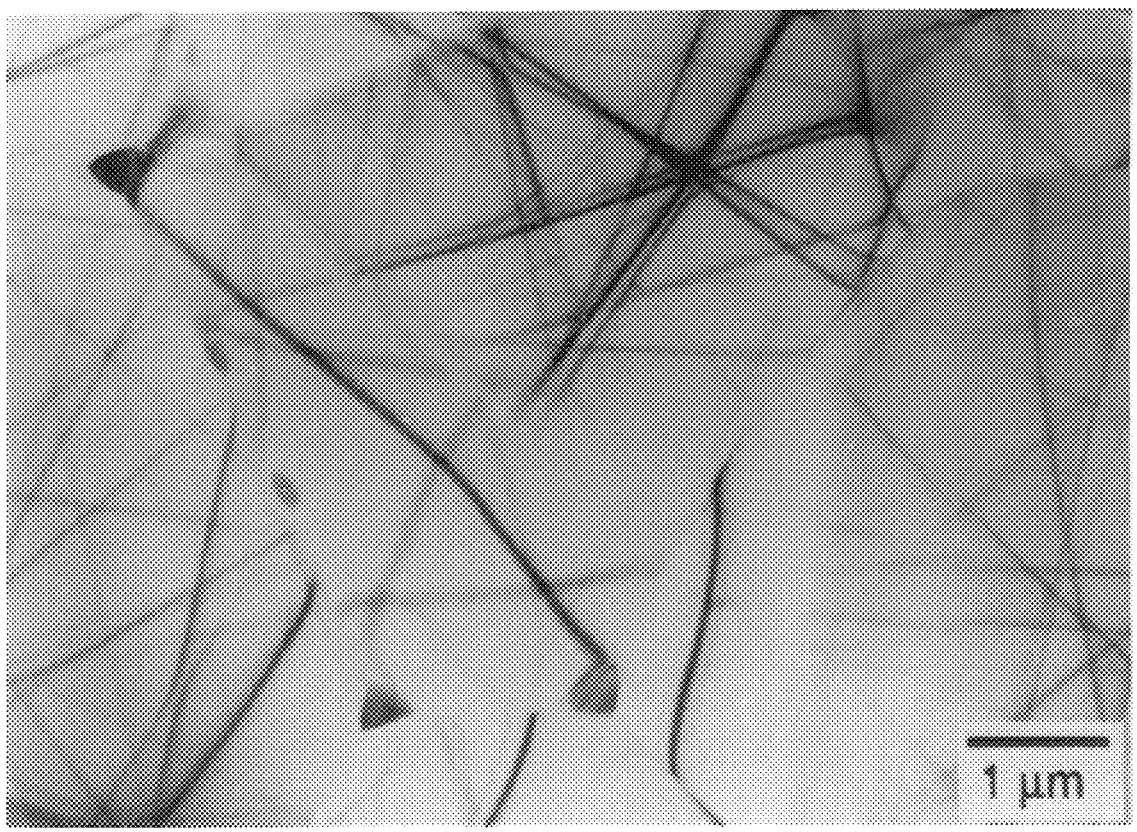
FIG. 20 is a transition electron photomicrograph showing a ceramic tissue of a sintered body of another comparative example.

FIGS. 19 and 20 are transition electron photomicrographs with respect to the sintered body No. 16 in a comparative example. At the triple points and grain boundaries, black precipitates (0.2 μm) were observed. As a result of observation of the precipitates by EDS, $Y_2Al_4O_9$ was detected. Besides, these precipitates were crystalline.

Figure 21:
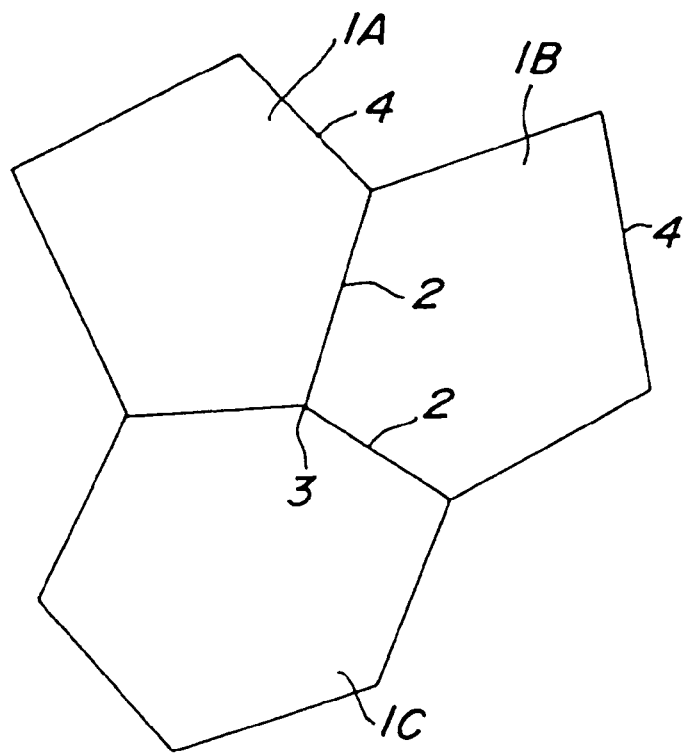
FIG. 21 is a schematic view showing a feature of microstructure of the sintered body of an embodiment of the present invention.

The features of the microstructure of the sintered bodies according to the present invention will be further explained referring to the schematic view of FIG. 21. In the sintered body according to the present invention, at each grain boundary 2 between crystal grains 1A and 1B, 1B and 1C, and 1C and 1A, adjacent to one another, no intergranular phase is present, which should be usually present between crystal grains, and substantially the crystal lattice is not disordered at the grain boundary 2 between adjacent crystal grains. And it is assumable that yttrium atoms are included in a disordered portion of the crystal lattice. This assumption is in conformity with the fact that a crystalline phase of an yttrium compound is totally not detected by an X-ray diffraction method.

Inside of each crystal grain, 1A, 1B or 1C, oxygen forms solid-solution as aforementioned. Additionally, it has been found that yttrium is not detected at triple points as well. However, even at triple points, yttrium is present on the surface of the crystal grains.

Figure 22A:
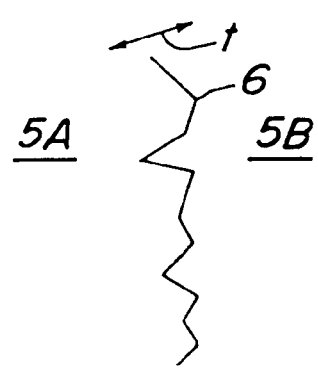
FIG. 22a is a schematic view illustrating the state of the grain boundary of adjacent crystal grains with respect to a sintered body of a comparative example.
Figure 22B:
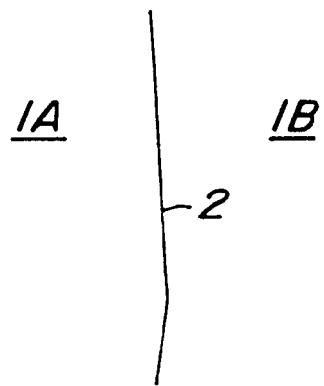
FIG. 22b is a schematic view illustrating the state of the grain boundary of adjacent crystal grains with respect to the sintered body of an embodiment of the present invention.

In the sintered body of comparative examples, as shown in FIG. 22a, the interface 6 between adjacent crystal grains 5A and 5B had an irregularly intermingled shape and was intricately bent. The width t of this intergranular phase was about 1–3 nm. In contrast thereto, in the sintered body according to the present invention, as shown in FIG. 22b, the interface 2 between crystal grains 1A and 1B extended substantially straight, and the width was not more than 1 nm. Further, the deviation of the position of the grain boundary was on a level of several aluminum atoms.

Then, aluminum nitride sintered bodies of experimental run No. 51–63 shown in Tables 7 and 8 were produced. As the starting powder, aluminum nitride powder obtained by a reductive nitriding method was used. Amounts of oxygen and metal impurities in this starting powder are shown in Table 7. Yttrium nitrate was dissolved in isopropyl alcohol to provide an additive solution. This additive solution was admixed with the aluminum nitride starting powder by using a pot mill. The amounts of the added yttrium as $Y_2O_3$ are shown in Table 7.

By axial press molding this starting powder at a pressure of 100 kgf/cm², a disc-type shaped body with a diameter of 200 mm was manufactured. This disc-type shaped body was received in a hot press mold, and sealed hermetically. The temperature was increased at a temperature increasing rate of 300° C./hour. In this case, the pressure was reduced at the temperature range from room temperature to 1000° C. Concurrently with the temperature increase, the pressure was raised. The maximum temperature was changed as shown in Table 8, each maximum temperature was retained for the retention time shown in Table 8.

With respect to each of the thus obtained sintered bodies, the total amount of metal impurities except yttrium was determined and shown in Table 7. Further, the content of yttrium (Y), a total oxygen content (O), a total carbon content (C), and excessive oxygen (the difference between the total oxygen content and the oxygen content in yttria) in the sintered bodies were shown in Table 7. Besides, the g-value, spin number, average particle diameter, thermal conductivity, strength, relative density and color were measured as aforementioned with respect to each sintered body. The results are shown in Table 8.

Further, the volume resistivity of each sintered body was determined as mentioned above. Also, the oxygen concentration in each aluminum nitride crystal grain constituting each sintered body was measured. These results of measurement are shown in Table 7.

TABLE 7

| No. | | Volume resistivity (Ω · cm) | Oxygen content in starting powder (wt %) | Amount of metal impurity in starting powder (ppm) | Amount of $Y_2O_3$ added | Amount of metal impurity except Y (ppm) | Y (ppm) | O (wt %) | C (wt %) | Amount of excessive oxygen (wt %) | Amount of oxygen in crystal grain by EPMA (wt %) |
|---|---|---|---|---|---|---|---|---|---|---|---|
| 51 | Comparative Example | 4.2E+14 | 1.2 | 90 | 5 | 90 | 36900 | 1.98 | 0.03 | 0.98 | 0.35 |
| 52 | Comparative Example | 8.2E+12 | 1.2 | 90 | 5 | 90 | 1100 | 0.25 | 0.02 | 0.22 | 0.21 |
| 53 | Example | 4.8E+11 | 1.2 | 90 | 0.03 | 80 | 210 | 0.69 | 0.03 | 0.68 | 0.65 |

TABLE 7-continued

| No. | | Volume resistivity (Ω · cm) | Oxygen content in starting powder (wt %) | Amount of metal impurity in starting powder (ppm) | Amount of $Y_2O_3$ added | Amount of metal impurity except Y (ppm) | Y (ppm) | O (wt %) | C (wt %) | Amount of excessive oxygen (wt %) | Amount of oxygen in crystal grain by EPMA (wt %) |
|---|---|---|---|---|---|---|---|---|---|---|---|
| 54 | Example | 6.8E+7 | 1.2 | 90 | 0.05 | 70 | 350 | 0.8 | 0.03 | 0.79 | 0.78 |
| 55 | Example | 5.0E+11 | 1.2 | 90 | 0.1 | 90 | 770 | 0.68 | 0.03 | 0.66 | 0.52 |
| 56 | Example | 1.7E+11 | 1.2 | 90 | 0.1 | 80 | 630 | 0.64 | 0.03 | 0.62 | 0.57 |
| 57 | Example | 2.8E+10 | 1.2 | 90 | 0.1 | 80 | 610 | 0.65 | 0.03 | 0.63 | 0.61 |
| 58 | Example | 3.3E+9 | 1.2 | 90 | 0.1 | 70 | 510 | 0.62 | 0.03 | 0.61 | 0.61 |
| 59 | Example | 4.1E+9 | 1.2 | 90 | 0.1 | 70 | 450 | 0.63 | 0.03 | 0.62 | 0.61 |
| 60 | Example | 8.0E+10 | 1.2 | 90 | 0.3 | 80 | 1900 | 0.68 | 0.03 | 0.63 | 0.61 |
| 61 | Example | 3.0E+10 | 1.2 | 90 | 0.3 | 80 | 650 | 0.59 | 0.03 | 0.57 | 0.55 |
| 62 | Example | 7.0E+10 | 1.2 | 90 | 0.5 | 70 | 2000 | 1.31 | 0.03 | 1.26 | 0.59 |
| 63 | Example | 3.0E+9 | 1.2 | 90 | 0.5 | 80 | 880 | 1.19 | 0.03 | 1.17 | 0.61 |

TABLE 8

| No. | | Maximum temperature (° C.) | Retention time (Hr) | g-value | Spin number (×10³ spin/mg) | Average grain diameter (μm) | Thermal conductivity (W/mK) | Strength (MPa) | Relative density (%) | Color |
|---|---|---|---|---|---|---|---|---|---|---|
| 51 | Comparative Example | 1750 | 5 | 2.001 | 0.1 | 1 | 150 | 260 | 98.8 | black |
| 52 | Comparative Example | 1950 | 5 | 2.0008 | 0.6 | 10 | 190 | 300 | 98.5 | amber |
| 53 | Example | 1850 | 5 | 1.9976 | 1.9 | 4 | 80 | 350 | 99.3 | amber |
| 54 | Example | 2000 | 5 | 1.9976 | 2.4 | 6 | 90 | 320 | 99.9 | amber |
| 55 | Example | 1800 | 5 | 1.9977 | 1.8 | 4 | 80 | 400 | 99.6 | amber |
| 56 | Example | 1850 | 5 | 1.9976 | 1.9 | 6 | 90 | 350 | 99.7 | amber |
| 57 | Example | 1900 | 5 | 1.9977 | 2 | 7 | 90 | 340 | 99.7 | amber |
| 58 | Example | 2000 | 5 | 1.9977 | 2.2 | 11 | 90 | 300 | 99.9 | amber |
| 59 | Example | 1900 | 10 | 1.9975 | 2.3 | 11 | 90 | 310 | 99.8 | amber |
| 60 | Example | 1900 | 5 | 1.9975 | 2.3 | 7 | 90 | 310 | 99.7 | amber |
| 61 | Example | 2000 | 5 | 1.9977 | 2.4 | 9 | 100 | 290 | 99.8 | amber |
| 62 | Example | 1900 | 5 | 1.9976 | 2.3 | 8 | 100 | 320 | 99.8 | amber |
| 63 | Example | 2000 | 5 | 1.9976 | 2.5 | 10 | 100 | 300 | 99.9 | amber |

In each sintered body of Comparative Examples 51 and 52, the amount of yttria added to the starting powder was 5% by weight, and in the sintered body it remained in an amount of about 3.7% or 0.1%, by weight. The oxygen content in the crystal particle was determined with an electron probe X-ray microanalyzer, and it was found to be 0.35% or 0.21%, by weight. Namely, since in experimental run No. 52 the hot press temperature was relatively higher, discharge of yttria proceeded on the sintering stage, and discharge of the oxygen from inside of the crystal particle also proceeded.

Furthermore, the volume resistivity of the sintered body is in the order of $10^{14}$ Ω·cm in Comparative Example 51, and in the order of $10^{12}$ Ω·cm in Comparative Example 52. Thus, the volume resistivity is lower in Comparative Example 52. This is considered that grain growth proceeded with discharging yttria, more in Comparative Example 52.

In contrast, in Examples 53–63, the amount of the oxygen in crystal grains determined by an electron probe X-ray microanalyzer is not less than 0.5% by weight, and the amount of the "excessive oxygen" is also not less than 0.5% by weight. Additionally, it has been found that most of the "excessive oxygen" is distributed within the crystal grains, except Examples 62 and 63.

Further in Examples 53–63, the yttria content in the sintered body is not more than 0.2% by weight, the g-value is not more than 2.000, the spin amount is not less than $1.0 \times 10^{13}$ spins/mg, the average grain diameter is not less than 4 μm and the relative density is not less than 99% In these sintered bodies, a volume resistivity of not more than $10^{12}$ Ω·cm has been obtained.

Then, the present inventors measured a spectrum by cathode luminescence with respect to each of the sintered bodies, experimental run numbers of which are shown in the aforementioned Tables 1–8. As the result, it has been found that an extreme decrease of the volume resistivity is recognized as mentioned above, in the sintered bodies that exhibit an intense main peak at 350–370 nm.

Such a peak within the wavelength range of 350–370 nm was confirmed in Examples 5–14, 23–29, 36–44 and 53–63. For brevity's sake, specifically with respect to the sintered bodies of Example 54 and Comparative Example 52 as a typical example, a concrete method for measuring spectra or the like, and detailed data will be exhibited hereinafter.

Figure 23:
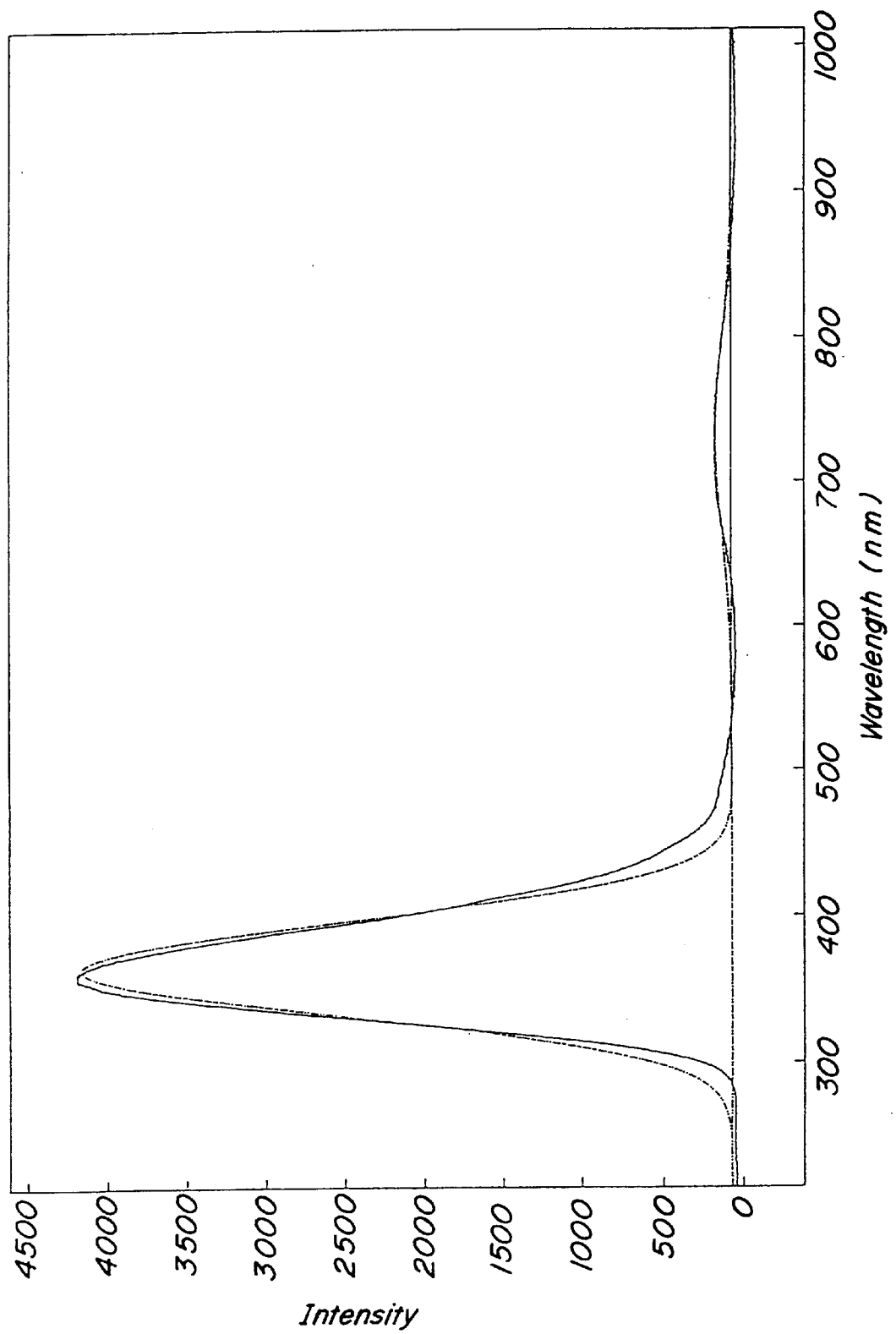
FIG. 23 is a spectrum obtained by cathode luminescence with respect to the sintered body of an embodiment (Example 54) of the present invention.

The surface of the sintered body of Example 54 was mirror-polished with diamond paste, then the spectrum was observed according to the cathode luminescence method. The result is shown in FIG. 23. In FIG. 23, the axis of ordinate shows an intensity of luminescence and the axis of abscissa shows a wavelength of luminescence. A strong peak has appeared in the wavelength range of 350–370 nm, and a weak peak has appeared in the wavelength range of 650–750 nm.

On the other hand, the surface of the sintered body of Comparative Example 52 was mirror-polished with diamond paste, then the spectrum was observed according to the cathode luminescence method. The result is shown in FIG. 24. As the result, weak peaks at about 340 nm, 500 nm and 600 nm are observed, respectively.

In FIG. 25 is shown comparison of Example 54 with Comparative Example 52 with respect to spectra obtained according to the cathode luminescence method. As is seen from the above, the luminescence intensity of the main peak in 350–370 nm that is characteristically shown in the sintered body according to the present invention is very high, as compared with each peak of the sintered body of Comparative Example.

Furthermore, with respect to the sintered body of Comparative Example 52, the distributions of oxygen concentration and yttrium atoms were measured by means of an electron probe X-ray microanalyzer (EPMA). As the result, in the case of sintered body of Comparative Example 52, the oxygen concentration was relatively low. Moreover, the portion wherein relatively much oxygen was present in the sintered body almost overlapped the portion wherein yttria was present. This overlapped portion substantially agreed with the position of the grain boundary shown by the scanning electron photomicrograph.

Figure 28:
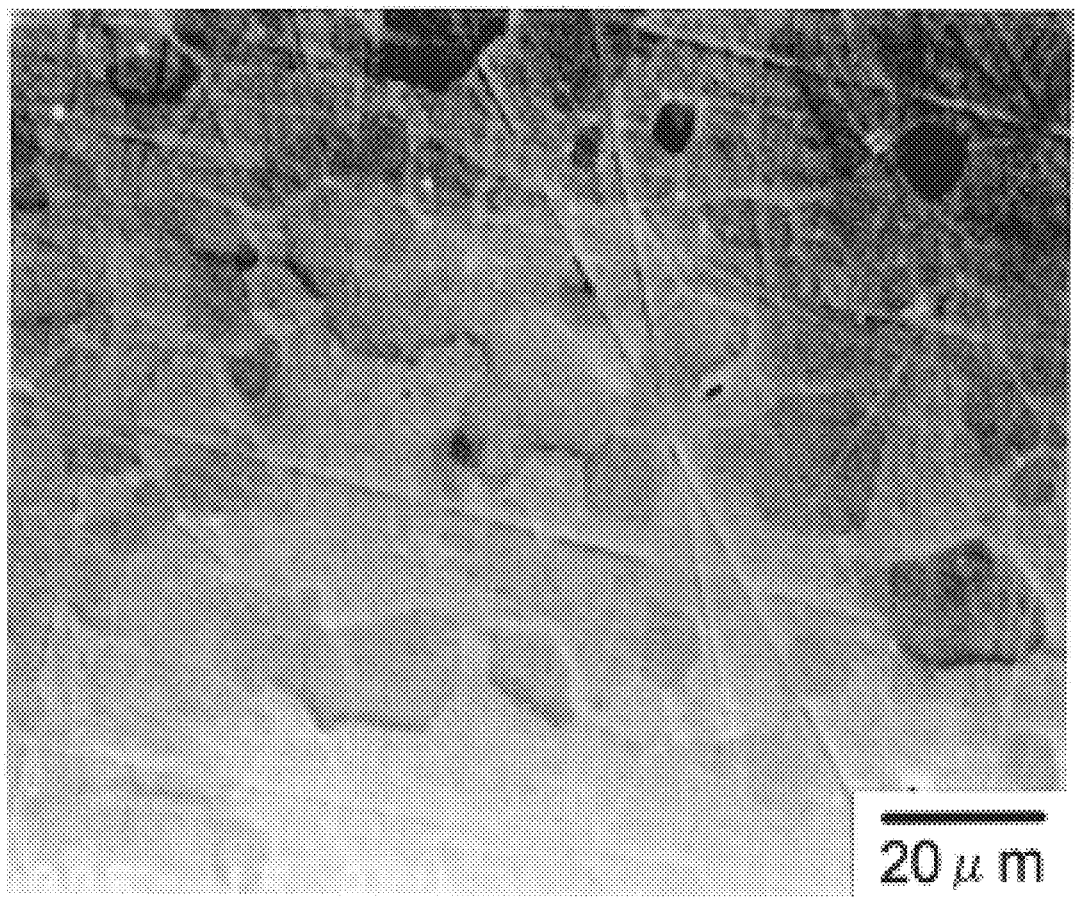
FIG. 28 is a scanning electron photomicrograph of a ceramic tissue in the same view field as FIG. 26 with respect to the sintered bodies of Example 54.

Further, with respect to the sintered body of Example 54, cathode luminescence two-dimensional mapping was conducted at a wavelength of 360 nm. The result is shown in FIG. 26. Besides, in FIG. 27 is shown a relationship between shades in the two-dimensional mapping shown in FIG. 26 and a luminescense intensity. Additionally, FIG. 28 is a scanning electron photomicrograph of a ceramic tissue with the same view field as FIG. 26.

In the result of the two-dimensional mapping shown in FIG. 26, a contrast of shades is observed. From a comparison of the two-dimensional mapping with the photograph of FIG. 28, it has been found that the shape of each particle shown in FIG. 28 completely laps over the shape of the dark portion or light portion shown in FIG. 26.

Therefore, the shades in the two-dimensional mapping is considered to depend on the crystalline orientation of each crystal grain. Namely, in the case where a crystal grain has a crystalline orientation perpendicular to electron radiation, the luminescence intensity according to the cathode luminescence method is increased. Thus, the difference in crystalline orientation of each crystal grain shown in FIG. 28 may be a direct cause of variation of the shades shown in FIG. 26. Besides, in FIG. 26, a portion corresponding to the grain boundary is always dark and not luminous. From the above result of measurement, it has been found that a very strong luminescence at wavelength 360 nm is emitted from the inside of crystal grains.

Metals can be embedded in the aluminum nitride sintered body according to the prevent invention. Articles embedded with an electrode can be used preferably particularly in an environment where impurities are abominated. Examples of such applications include: ceramic electrostatic chucks; ceramic heaters; and high frequency electrode apparatuses. The use for electrostatic chucks is particularly suitable.

If the metal embedded articles according to the invention are used as an electrostatic chuck, for example, for attracting semiconductor wafers, since a dielectric layer can be made to have a volume resistivity of not more than $1 \times 10^{12}$ $\Omega \cdot cm$ at room temperature, it may be possible to extremely improve attracting characteristics of the electrostatic chuck in the temperature range of around room temperature or below −60° C. In this case, even if the thickness of the dielectric layer is made to be not less than 500 $\mu m$, when voltage is applied, electric charge is transferred from the electrode onto the surface of the insulative dielectric layer, so that a sufficient attracting force can be obtained. Immediately after turning off the voltage, the electric charge is lost quickly. Therefore, the response for chucking or releasing wafer is also good. It has become possible thereby to attract and hold stably a large-sized semiconductor wafer of not less than 8 inches in the extremely wide temperature range from a low temperature region of particularly about −60° C. to a high temperature region of not less than 300° C.

Such a metal member to be embedded in the aluminum nitride sintered body is preferred to be a plate-type metal bulk material. In this case, when the metal embedded article is an electrostatic chuck, the metal member is a plate-type electrode made from the metal bulk material. The term "plate- type metal bulk material" should be understood to mean a monolitic plate-type material formed of metal, for example, as shown in FIG. 30, other than a spiral or zigzag shaped wire or plate.

The metal member, since it is fired together with aluminum nitride powder, is preferred to be formed of a high melting metal. Examples of such a high melting metal include: tantalum; tungsten: molybdenum; platinum; rhenium; hafnium; and alloys thereof. From the viewpoint of preventing semiconductors from contamination, tantalum, tungsten, molybdenum, platinum and alloys thereof are more preferred. Examples of objects to be treated with electrostatic chucks include an aluminum wafer and the like, in addition to the semiconductor wafer.

Examples of such a plate-type bulk material include the followings:
(1) Plate-type bulk materials formed into a thin plate.
(2) Bulk materials formed into a plate-type electrode having a number of small spaces therein. This includes bulk materials and meshed bulk materials consisting of a plate-type body having a number of small holes therein. As a plate-type body having a number of small holes therein, a punching metal can be exemplified. However, when the bulk material is a punching metal comprising a high melting metal, since the high melting metal has a high hardness, it is difficult to perforate by punching a number of small holes in a plate consisting of the high melting metal and, therefore, a machining cost will become extremely high. In this respect, in the case where the bulk material is a metal net, a wire material consisting of a high melting metal is readily available so that the metal net can be manufactured by knitting this wire material.

The shape of the mesh and the wire diameter of such a metal net are not specifically limited. However, 150 meshes with wire of 0.03 mm diameter to 6 meshes with wire of 0.5 mm diameter could be employed without problems. Further, the cross sectional shape of the wire material constructing the metal net may be various rolled shapes such as circular, ellipse, rectangular and the like. Here, one mesh is meant by one wire per an inch.

When the present invention is applied to an electrostatic chuck, the electrodes of the electrostatic chuck can be connected with a high frequency power source to supply the electrodes with a high frequency voltage together with a DC voltage, whereby this electrode also can be used as an electrode for generating plasma. In this case, when, for example, the electrodes are made of tungsten and the frequency is 13.56 MHz, the thickness of the electrode is preferred to be not less than 430 $\mu m$. However, since it is difficult to form an electrode having such a thickness by means of a screen printing method, the electrode is formed of a metal bulk body. Further, a dielectric layer having a thickness ranging 0.5–5.0 mm, since a self-exotherm due to dielectric loss is not so high, can be used as a high frequency electrode with no problem.

Figure 29:
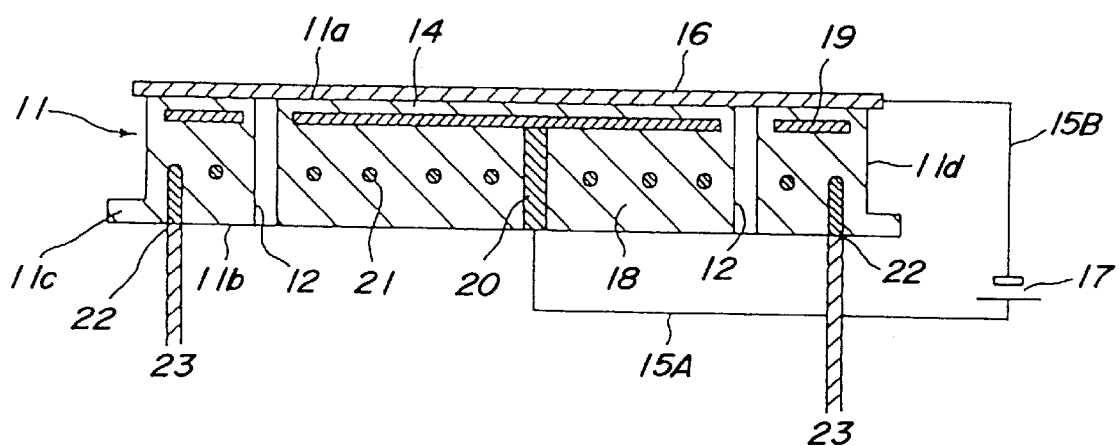
FIG. 29 is a cross sectional view schematically showing an example of electrostatic chuck.

FIG. 29 is a cross sectional view schematically showing an embodiment of the electrostatic chuck. FIG. 30a is a perspective view showing the electrostatic chuck shown in FIG. 29, with a part cut away. FIG. 30b is a perspective view showing an electrode 13 formed of a metal net.

A ring shaped flange 11c is provided on a circumferential side surface 11d of a substantially disc shaped substrate 11. An electrode 19 formed of a metal net 13 is embedded in the substrate 11. A dielectric layer 14 having a predetermined thickness is formed on the surface 11a for loading a semiconductor wafer 16. A terminal 20 is embedded in a supporting portion 18 of the substrate. One end surface of the terminal 20 is exposed at the rear surface 11b of the substrate 11. Through-holes 12 for inserting a pin for elevating and lowering the semiconductor wafer 16 are formed at predetermined positions of the substrate 11.

A DC power source 17 is connected via an electric wire 5A to the terminal 20, and a negative electrode of the DC power source 17 is connected via an electric wire 5B to the semiconductor wafer 16. In these embodiments, the electrode 19 is formed of a metal net 13 as shown in FIGS. 30a and 30b. The metal net 13 comprises a circular rim wire 13a and wires 13b arranged crosswise within the rim wire 13a, thus forming meshes 24 in the net.

In the substrate 11, a resistance heating element 21 is embedded between the electrode 19 and the back surface 11b. Both the end portions of the resistance heating element 21 are connected to the terminals 22, respectively, and the terminals 22 are connected to the external terminals 23, respectively. This resistance heating element is for heating the semiconductor wafer during chucking the wafer and not always necessary.

Further, the aluminum nitride sintered body according to the invention can be used as a substrate for semiconductor manufacturing apparatuses, such as susceptors for holding a semiconductor wafer, dummy wafers, shadow rings, tubes for generating a high frequency plasma, domes for generating a high frequency plasma, high frequency transmitting windows, lift pins for supporting a semiconductor wafer, shower plates and the like.

As an electronic functional materials to which the aluminum nitride sintered body according to the present invention is applicable, a heating source for induced heating (a heating material) can be exemplified. Namely, the sintered body according to the invention, since it has a high purity as well as a high corrosive resistance against plasma, can be utilized as a heating source for induced heating to be used in a plasma atmosphere.

The present inventors manufactured an electrostatic chuck as shown in FIG. 29. As a starting powder, an aluminum nitride powder obtained by a reductive nitriding method was employed. The amount of the oxygen was 1.2% by weight and the amount of the metal impurities was 90 ppm in the starting powder. An additive solution was prepared by dissolving yttrium nitrate in isopropyl alcohol, and this additive solution was admixed with the aluminum nitride starting powder by using a pot mill. The proportion of the mixed yttria as $Y_2O_3$ was 0.05% by weight.

As the electrode 19, a metal net 13 made of molybdenum was used. The metal net 13 was knitted with a molybdenum wire having a diameter of 0.5 mm, at a density of 15 ends per 1 inch. The metal net 13 was embedded in the aforementioned starting powder, a pressure of 100 kgf/cm$^2$ was applied in a perpendicular direction of to the metal net 13 and axial press molding was conducted to provide a disc-type shaped body having a diameter of 200 mm. This disc-type shaped body was received in a hot press mold and sealed hermetically. The temperature was increased at a temperature increasing rate of 300° C./hour. In this case, the pressure was reduced in the range of from room temperature to 1000° C. Concurrently with the temperature increase up above this temperature range, the pressure was raised. The maximum temperature set at 2000° C. was held for 5 hours.

With respect to the thus obtained sintered body, measurement was conducted according to the methods mentioned above. The total amount of the metal impurities except yttrium was 90 ppm, the yttrium (Y) was 320 ppm, the total oxygen (O) was 0.90% by weight, the total carbon (C) was 0.03% by weight, and an excessive oxygen (O) was 0.89% by weight. Additionally, this sintered body had a g-value of ESR spectrum of 1.9977, a peak ratio (Al/Mn) of 3.50, a spin number of $2.9 \times 10^{13}$ spins/mg, an average grain diameter of 11 μm, a thermal conductivity of 60, a strength of 320 MPa, and a relative density of 99.9%.

Further, the spectrum was measured by means of a cathode luminescence method, and the same main peak as that of FIG. 23 was observed in the wavelength range of 350–370 nm. The mount of the oxygen in crystal grains determined by an electron probe X-ray microanalyzer was 0.79% by weight.

The surface of the dielectric layer of the obtained sintered body was machined, to make the thickness of the dielectric layer 14 to be 1 mm. Through-holes 12 were perforated from the back surface side 11b of the sintered body with a machining center. Further, a terminal 20 was connected to electrodes 19. However, the resistance heating element was not embedded. The electrostatic chuck had a dimension of 200 mm diameter and 12 mm thickness. The attracting force of this electrostatic chuck was determined. The attracting force that was measured at an interval of 100° C. from room temperature to 300° C. was 60–100 g/cm$^2$ at any temperatures. Besides, the volume resistivity at room temperature of the dielectric layer was $1 \times 10^7$ Ω·cm.

As mentioned above, according to the present invention, a novel aluminum nitride sintered body with a high purity and a low volume resistivity can be provided. Moreover, there is the provision of a novel electronic functional material comprising such an aluminum nitride sintered body, which has a volume resistivity on a semiconductor level, and an electrostatic chuck using such an aluminum nitride sintered body.

What is claimed is:

1. An aluminum nitride sintered body comprising at least one rare earth element in a total amount (as oxide thereof) of between 150 ppm and 0.5%, by weight, at least one metal impurity except rare earth elements in a total amount of not more than 900 ppm, carbon in a total amount of not more than 0.05% by weight, and oxygen in an amount such that the difference between the total oxygen content in the aluminum nitride sintered body and the oxygen content in one or more oxides converted from said rare earth element is between 0.5% and 2.0% , by weight, in which the aluminum nitride sintered body has a relative density of not less than 98.5%, exhibiting only peaks based on AlN single phase detected by an X-ray diffraction method, and exhibiting a main peak in a wavelength range between 350 nm and 370 nm in a spectrum obtained by a cathode luminescence method, and a volume resistivity at room temperature of between $1.0 \times 10^6$ and $1.0 \times 10^{12}$ Ω·cm.

2. The aluminum nitride sintered body according to claim 1, further comprising constituent aluminum nitride crystal grains having an average grain diameter of not less than 3.0 μm.

3. The aluminum nitride sintered body according to claim 2, wherein said constituent aluminum nitride crystal grains have an average grain diameter between 5 μm and 20 μm.

4. The aluminum nitride sintered body according to claim 1, wherein the amount of said rare earth element is not more than 0.1% by weight.

5. The aluminum nitride sintered body according to claim 1, wherein the amount of said metal impurity is not more than 500 ppm.

6. The aluminum nitride sintered body according to claim 1, wherein said main peak is generated from inside of said constituent aluminum nitride crystal grains.

7. The aluminum nitride sintered body according to claim 1, wherein said volume resistivity at room temperature is not more than $1.0 \times 10^{11}$ Ω·cm.

8. The aluminum nitride sintered body according to claim 2, wherein said oxygen concentration in said constituent aluminum nitride crystal grains is measured by an electron probe X-ray microanalyzer.

9. The aluminum nitride sintered body according to claim 2, wherein said rare earth element is not substantially present inside the aluminum nitride crystal grains, but is present at a grain boundary of adjacent two aluminum nitride crystal grains.

10. The aluminum nitride sintered body according to claim 9, wherein said rare earth element does not form a crystalline phase at said grain boundary.

11. The aluminum nitride sintered body according to claim 9, wherein a crystal lattice constituting each aluminum nitride crystal grain comprises a disordered portion having a width of not more than 1 nm at said grain boundary.

12. The aluminum nitride sintered body according to claim 9, wherein the rare earth element is not substantially present in a crystalline phase at a triple point of the aluminum nitride sintered body, but present on a surface or near the surface of each crystal grain facing said triple point.

13. The aluminum nitride sintered body according to claim 1, wherein unpaired electron of aluminum in a spectrum obtained by an electron spin resonance method has a g-value of not more than 2.000.

14. The aluminum nitride sintered body according to claim 13, wherein an amount of spin per unit mg of aluminum obtained from a spectrum by an electron spin resonance method is not less than $1 \times 10^{13}$ spins/mg.

15. An article comprising the aluminum nitride sintered body according to claim 1, which is in a bulk form.

16. An article comprising the aluminum nitride sintered body according to claim 15 and a metal member embedded therein.

17. An electronic functional material comprising the aluminum nitride sintered body according to claim 1.

18. An electrostatic chuck having an attracting surface for attracting and holding a semiconductor, which comprises a substrate comprising the aluminum nitride sintered body according to claim 15, a plate-shaped electrode embedded in said substrate and a power source for supplying said plate-shaped electrode with a DC power.

19. The aluminum nitride sintered body according to claim 1, wherein said body has a thermal conductivity in the range of 60–120 W/mK.

* * * * *